(12) United States Patent  
Arai et al.

(10) Patent No.: US 8,269,217 B2  
(45) Date of Patent: Sep. 18, 2012

(54) DISPLAY UNIT WITH THIN FILM TRANSISTOR HAVING THROUGH HOLES IN SOURCE/DRAIN ELECTRODE

(75) Inventors: Toshiaki Arai, Kanagawa (JP); Narihiro Morosawa, Kanagawa (JP); Kazuhiko Tokunaga, Kanagawa (JP); Hiroshi Sagawa, Kanagawa (JP); Kiwamu Miura, Kanagawa (JP)

(73) Assignee: Sony Corporation, Tokyo (JP)

( * ) Notice: Subject to any disclaimer, the term of this patent is extended or adjusted under 35 U.S.C. 154(b) by 139 days.

(21) Appl. No.: 12/696,270

(22) Filed: Jan. 29, 2010

(65) Prior Publication Data

US 2010/0200843 A1 Aug. 12, 2010

(30) Foreign Application Priority Data

Feb. 9, 2009 (JP) ................................. 2009-027646

(51) Int. Cl.  
*H01L 29/10* (2006.01)

(52) U.S. Cl. ............ 257/43; 257/E29.273; 257/E51.022

(58) Field of Classification Search .................... None  
See application file for complete search history.

(56) References Cited

U.S. PATENT DOCUMENTS

| | | | |
|---|---|---|---|
| 6,709,902 B2 | 3/2004 | Kitakado et al. | |
| 6,855,954 B1 | 2/2005 | Zhang | |
| 7,265,384 B2* | 9/2007 | Oh .................................. | 257/59 |
| 2001/0011868 A1 | 8/2001 | Fukunaga et al. | |
| 2001/0039081 A1 | 11/2001 | Miyamoto et al. | |
| 2002/0020875 A1* | 2/2002 | Arao et al. ..................... | 257/347 |
| 2002/0047579 A1 | 4/2002 | Kunii et al. | |
| 2002/0123175 A1* | 9/2002 | Yamazaki et al. ............. | 438/149 |
| 2003/0089909 A1 | 5/2003 | Miyairi et al. | |
| 2003/0203545 A1* | 10/2003 | Hamada et al. ................ | 438/149 |
| 2006/0092191 A1 | 5/2006 | Sakai et al. | |
| 2007/0072439 A1* | 3/2007 | Akimoto et al. .............. | 438/795 |
| 2007/0085112 A1 | 4/2007 | Yamazaki et al. | |
| 2007/0170434 A1* | 7/2007 | Inoue et al. ..................... | 257/72 |
| 2009/0065778 A1 | 3/2009 | Tsubata et al. | |
| 2009/0278120 A1 | 11/2009 | Lee et al. | |

FOREIGN PATENT DOCUMENTS

| | | |
|---|---|---|
| JP | 2006-165529 | 6/2006 |
| JP | 2006-165532 | 6/2006 |
| JP | 2007-115808 | 5/2007 |

OTHER PUBLICATIONS

Hayashi, R. et al.; "Improved Amorphous In-ga-Zn-0 TFT's", SID 2008 Proceedings, pp. 621-624.  
Arai, T. et al.; "Thin Film Transistor, Display Unit, and Method of Manufacturing Thin Film Transistor," U.S. Appl. No. 12/629,283, filed Dec. 2, 2009.

* cited by examiner

*Primary Examiner* — Evan Pert  
*Assistant Examiner* — Fei Fei Yeung Lopez  
(74) *Attorney, Agent, or Firm* — SNR Denton US LLP

(57) ABSTRACT

A thin film transistor with which oxygen is easily supplied to an oxide semiconductor layer and favorable transistor characteristics are able to be restored and a display unit including the same are provided. The thin film transistor includes sequentially over a substrate a gate electrode, a gate insulting film, an oxide semiconductor layer including a channel region, and a channel protective layer covering the channel region A source electrode and a drain electrode are formed on the oxide semiconductor layer located on both sides of the channel protective layer, and at least one of the source electrode and the drain electrode has an aperture to expose the oxide semiconductor layer.

8 Claims, 25 Drawing Sheets

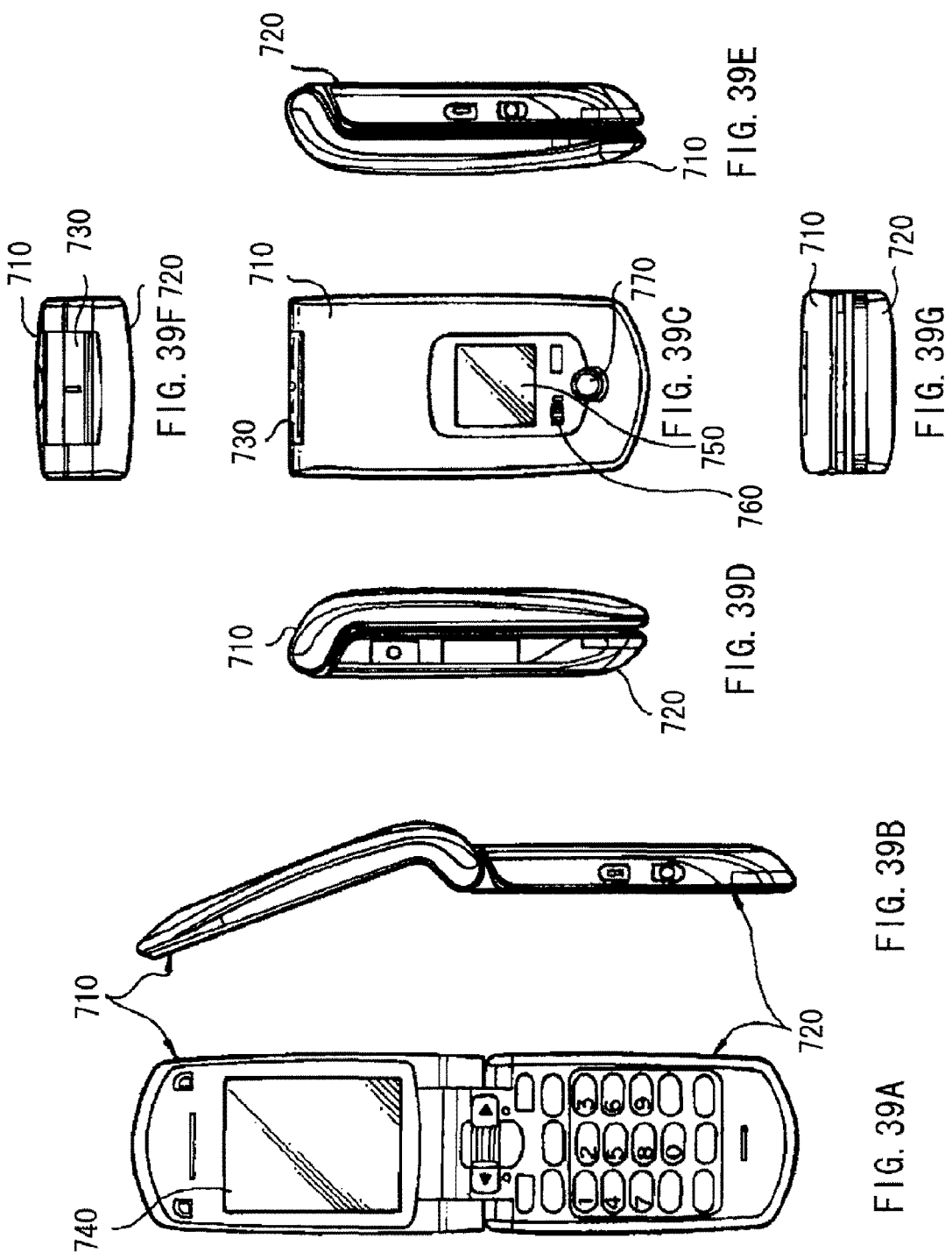

DISPLAY UNIT WITH THIN FILM TRANSISTOR HAVING THROUGH HOLES IN SOURCE/DRAIN ELECTRODE

BACKGROUND OF THE INVENTION

1. Field of the Invention

The present invention relates to a thin film transistor (TFT) having an oxide semiconductor layer as a channel and a display unit including the same.

2. Description of the Related Art

An oxide semiconductor composed of, for example, a zinc oxide, an indium gallium zinc oxide (IGZO) or the like shows superior characteristics as an active layer of a semiconductor device. In recent years, development has been promoted in an effort to apply the oxide semiconductor to a TFT, a light emitting device, a transparent conducting film or the like.

For example, in the TFT including the oxide semiconductor, electron mobility is high and its electric characteristics are superior compared to the existing TFT including amorphous silicon (a-Si: H) used for a liquid crystal display unit as a channel. Further, the TFT including the oxide semiconductor has an advantage that high mobility is able to be expected even at low temperature around room temperature.

Meanwhile, it has been known that in the oxide semiconductor, the heat resistance is not sufficient, and thus due to heat treatment in a manufacturing process of the TFT, oxygen, zinc and the like are detached and lattice defect is formed. The lattice defect results in forming an electrically shallow impurity level, and causes low resistance of the oxide semiconductor layer. This results in normally-on type operation, that is depression type operation in which a drain current is flown without applying a gate voltage, the threshold voltage is decreased as the defect level is increased, and the leakage current is increased.

Thus, in the past, it has been known that oxygen annealing is performed under high temperature after a TFT is formed and thereby oxygen is supplied to an absent portion in which oxygen is lacked or oxygen is detached in the oxide semiconductor layer to restore the characteristics as described in, for example, Japanese Unexamined Patent Application Publication Nos. 2006-15529 and 2006-165532.

SUMMARY OF THE INVENTION

However, there has been a disadvantage that the transistor characteristics are hardy restored according to the shape and the size of a TFT.

It is desirable to provide a thin film transistor with which oxygen is easily supplied to an oxide semiconductor layer and favorable transistor characteristics are able to be restored, and a display unit including the thin film transistor.

According to an embodiment of the invention, there is provided a first thin film transistor including sequentially over a substrate: a gate electrode; a gate insulting film; an oxide semiconductor layer including a channel region; and a channel protective layer covering the channel region, in which a source electrode and a drain electrode are formed on the oxide semiconductor layer located on both sides of the channel protective layer, and at least one of the source electrode and the drain electrode has an aperture to expose the oxide semiconductor layer.

According to an embodiment of the invention, there is provided a second thin film transistor including sequentially over a substrate: a gate electrode; a gate insulting film; an oxide semiconductor layer including a channel region; and a channel protective layer covering the channel region, wherein a source electrode and a drain electrode are formed on the oxide semiconductor layer located on both sides of the channel protective layer, and the source electrode and the drain electrode are isolated in a channel width direction by a groove to expose the oxide semiconductor layer. The channel width direction is a width in a direction perpendicular to a direction in which the source electrode and the drain electrode are opposed (in general, a longitudinal direction).

According to an embodiment of the invention, there is provided a third thin film transistor including sequentially over a substrate: a gate electrode; a gate insulting film; an oxide semiconductor layer including a channel region; and a channel protective layer covering the channel region, in which a source electrode and a drain electrode are formed on the oxide semiconductor layer located on both sides of the channel protective layer, and a protrusion region in which the oxide semiconductor layer is exposed from an end of the source electrode or the drain electrode is provided along a side opposed to a side overlapped with the channel protective layer of at least one of the source electrode and the drain electrode.

A first to a third display units according to the embodiment of the invention include a thin film transistor and a display device, in which the thin film transistors thereof are respectively composed of the first to the third thin film transistors.

In the first thin film transistor of the embodiment of the invention, the aperture to expose the oxide semiconductor layer is provided in at least one of the source electrode and the drain electrode. Thus, in the case where oxygen annealing is provided under high temperature after forming the thin film transistor, oxygen is easily supplied from the aperture to an absent portion in which oxygen is lacked or oxygen is detached in the oxide semiconductor layer.

In the second thin film transistor of the embodiment of the invention, the source electrode and the drain electrode are isolated in the channel width direction by the groove to expose the oxide semiconductor layer. Thus, in the case where oxygen annealing is provided under high temperature after forming the thin film transistor, oxygen is easily supplied from the groove to an absent portion in which oxygen is lacked or oxygen is detached in the oxide semiconductor layer.

In the third thin film transistor of the embodiment of the invention, the protrusion region in which the oxide semiconductor layer is exposed from the end of the source electrode or the drain electrode is provided along the side opposed to the side overlapped with the channel protective layer of at least one of the source electrode and the drain electrode. Thus, in the case where oxygen annealing is provided under high temperature after forming the thin film transistor, oxygen is easily supplied from the protrusion region to an absent portion in which oxygen is lacked or oxygen is detached in the oxide semiconductor layer.

The first to the third display units of the embodiment of the invention respectively include the first to the third thin film transistors of the embodiment of the invention. Thus, low resistance of the oxide semiconductor layer of the thin film transistor is inhibited and thus the leakage current is suppressed, and light display with high luminance is enabled.

According to the first thin film transistor of the embodiment of the invention, the aperture to expose the oxide semiconductor layer is provided in at least one of the source electrode and the drain electrode. Thus, oxygen is able to be easily supplied from the aperture to the oxide semiconductor layer, and favorable transistor characteristics are able to be restored.

In the second thin film transistor of the embodiment of the invention, the source electrode and the drain electrode are isolated in the channel width direction by the groove to expose the oxide semiconductor layer. Thus, oxygen is easily supplied from the groove to the oxide semiconductor layer, and favorable transistor characteristics are able to be restored.

In the third thin film transistor of the embodiment of the invention, the protrusion region in which the oxide semiconductor layer is exposed from the end of the source electrode or the drain electrode is provided along the side opposed to the side overlapped with the channel protective layer of at least one of the source electrode and the drain electrode. Thus, oxygen is easily supplied from the protrusion region to the oxide semiconductor layer, and favorable transistor characteristics are able to be restored.

The first to the third display units of the embodiment of the invention respectively include the first to the third thin film transistors of the embodiment of the invention. Thus, low resistance of the oxide semiconductor layer of the thin film transistor is inhibited and thus the leakage current is able to be suppressed, and light display with high luminance is enabled.

Other and further objects, features and advantages of the invention will appear more fully from the following description.

BRIEF DESCRIPTION OF THE DRAWINGS

FIG. 39A is an elevation view of a fifth application example unclosed.

FIG. 39B is a side view thereof,

FIG. 39C is an elevation view of the fifth application example closed.

FIG. 39D is a left side view thereof.

FIG. 39E is a right side view thereof.

FIG. 39F is a top view thereof, and

FIG. 39G is a bottom view thereof.

DETAILED DESCRIPTION OF THE PREFERRED EMBODIMENTS

Embodiments of the invention will be hereinafter described in detail with reference to the drawings. The description will be given in the following order:

1. First embodiment (example that an aperture is provided in a source electrode and a drain electrode);

2. Second embodiment (example that the source electrode and the drain electrode are isolated by a groove); and 3. Third embodiment (example that a protrusion region is provided outside the source electrode and the drain electrode).

1. First Embodiment

Figure 1:
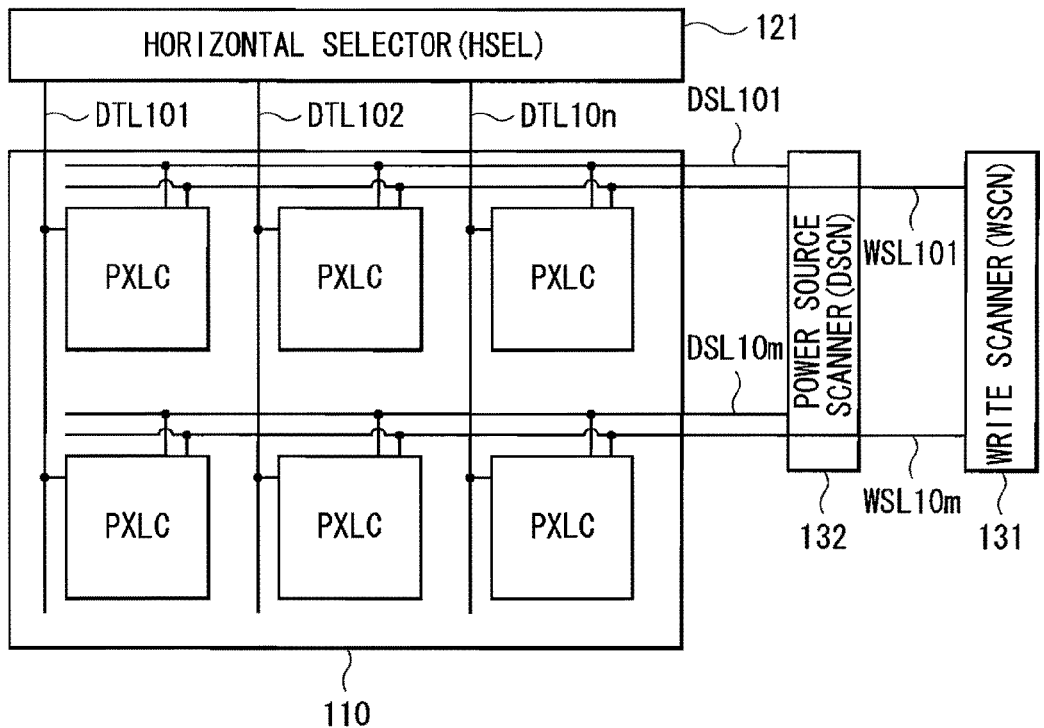
FIG. 1 is a diagram illustrating a configuration of a display unit according to a first embodiment of the invention.

FIG. 1 illustrates a configuration of a display unit according to a first embodiment of the invention. The display unit is used as an ultrathin organic light emitting color display unit or the like. In the display unit, for example, a display region 110 in which pixels PXLCs composed of a plurality of organic light emitting devices 10R, 10G, and 10B described later are arranged in a matrix state as a display device is formed in an after-mentioned TFT substrate 1. On the periphery of the display region 110, a horizontal selector (HSFL) 121 as a signal section, and a write scanner (WSCN) 131 and a power source scanner (DSCN) 132 as a scanner section are formed.

In the display region 110, signal lines DTL 101 to DTL 10$n$ are arranged in the column direction, and scanning lines WSL 101 to WSL 10$m$ and power source lines DSL 101 to DSL 10$m$ are arranged in the row direction. A pixel circuit 140 including the organic light emitting device PXLC (one of 10R, 10G, and 10B (sub pixel)) is provided at each cross section between each signal line DTL and each scanning line WSL. Each signal line DTL is connected to the horizontal selector 121. A video signal is supplied from the horizontal selector 121 to the signal line DTL. Each scanning line WSL is connected to the write scanner 131. Each power source line DSL is connected to the power source line scanner 132.

Figure 2:
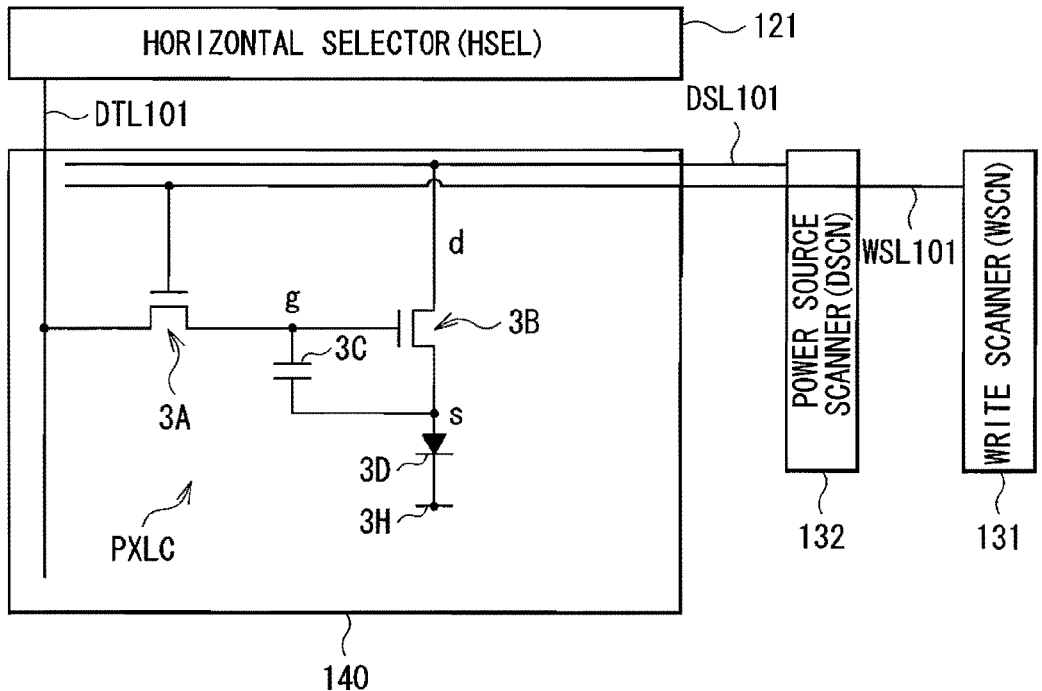
FIG. 2 is an equivalent circuit diagram illustrating an example of the pixel drive circuit illustrated in FIG. 1.

FIG. 2 illustrates an example of the pixel circuit 140. The pixel circuit 140 is an active drive circuit having a sampling transistor 3A, a drive transistor 3B, a retentive capacity 3C, and a light emitting device 3D composed of the organic light emitting device PXLC. In the sampling transistor 3A, its gate is connected to the corresponding scanning line WSL 101, one of its source and its drain is connected to the corresponding signal line DTL 101, and the other thereof is connected to a gate g of the drive transistor 3B. In the drive transistor 3B, its drain d is connected to the corresponding power source line DSL 101, and its source s is connected to an anode of the light emitting device 3D. A cathode of the light emitting device 3D is connected to a ground wiring 3H. The ground wiring 3H is commonly wired to all pixels PXLCs. The retentive capacity 3C is connected between the source s and the gate g of the drive transistor 3B.

The sampling transistor 3A makes conduction in accordance with a control signal supplied from the scanning line WSL 101, performs sampling of a signal potential of a video signal supplied from the signal line DTL 101, and retains the result into the retentive capacity 3C. The drive transistor 3B receives a current supply from the power source line DSL 101 in the first potential, and supplies a drive current to the light emitting device 3D in accordance with the signal potential retained in the retentive capacity 3C. The light emitting device 3D emits light at luminance in accordance with the signal potential of the video signal by the supplied drive current.

Figure 3:
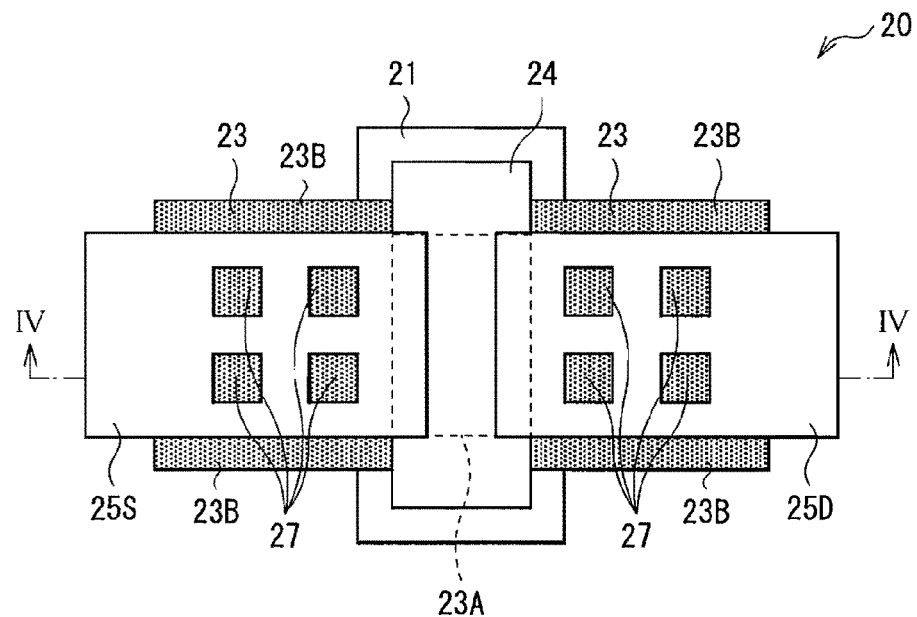
FIG. 3 is a plan view illustrating a structure of the TFT illustrated in FIG. 2.
Figure 4:
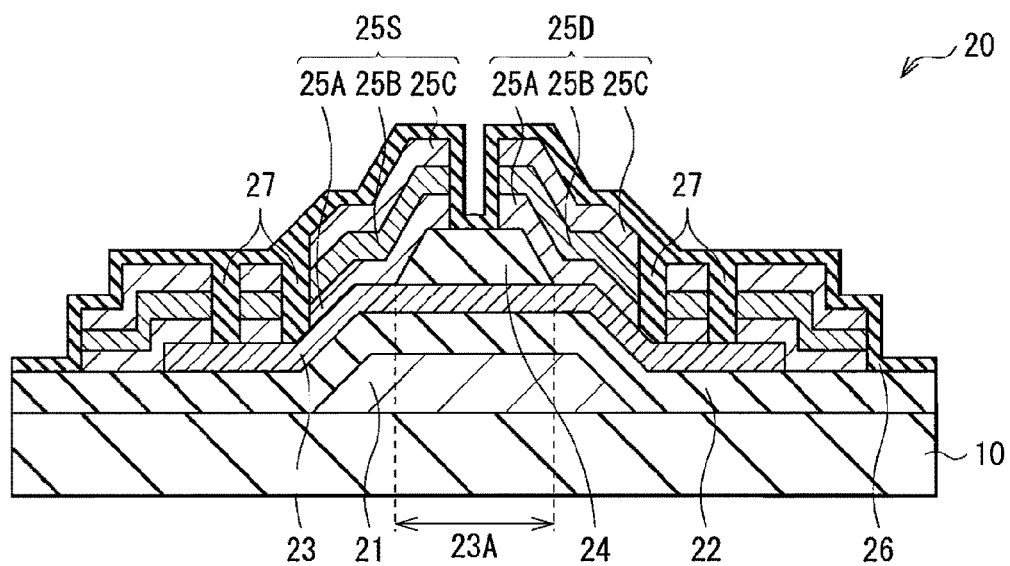
FIG. 4 is a cross sectional view taken along line IV-IV of FIG. 3.

FIG. 3 illustrates a planar structure of a TFT 20 configuring the sampling transistor 3A and the drive transistor 3B illustrated in FIG. 2. FIG. 4 illustrates a cross sectional structure taken along line IV-IV of FIG. 3. The TFT 20 is an oxide semiconductor transistor sequentially having, for example, a gate electrode 21, a gate insulating film 22, an oxide semiconductor layer 23, a channel protective layer 24, a source electrode 25S, a drain electrode 25D, and a passivation film 26 over a substrate 10. The oxide semiconductor represents an oxide of zinc, indium, gallium, tin, or a mixture thereof, and is known to show superior semiconductor characteristics.

The gate electrode 21 controls an electron density in the oxide semiconductor layer 23 by a gate voltage applied to the TFT 20. The gate electrode 21 has, for example, a two-layer structure composed of a molybdenum (Mo) layer having a thickness of 50 nm and an aluminum (Al) layer or an aluminum alloy layer having a thickness of 400 nm. Examples of aluminum alloy layers include an aluminum-neodymium alloy layer.

The gate insulating film 22 has, for example, a thickness of about 400 nm and is made of a silicon oxide film, a silicon nitride film, a silicon oxynitride film, an aluminum oxide film, or a laminated film thereof.

The oxide semiconductor layer 23 has, for example, a thickness from 20 nm to 100 nm both inclusive, and is composed of indium gallium zinc oxide (IGZO).

The channel protective layer 24 is preferably a layer that makes an oxygen amount detached from the oxide semiconductor thin film layer 23 small and that supplies a small amount of hydrogen to the oxide semiconductor thin film layer 23. The channel protective layer 24 has, for example, a thickness of about 200 nm, and is made of a silicon oxide film, a silicon nitride film, a silicon oxynitride film, an aluminum oxide film, or a laminated film thereof.

The source electrode 25S and the drain electrode 25D are formed on the oxide semiconductor layer 23 located on both sides of the channel protective layer 24. In the oxide semiconductor layer 23, a section corresponding to a region between the source electrode 25S and the drain electrode 25D is a channel region 23A. The channel region 23A is covered with the channel protective layer 24. Further, both sides in the channel width direction of the oxide semiconductor layer 23 are an exposed portion 23B not covered with the channel protective layer 24, the source electrode 25S or the drain electrode 25D.

The source electrode 25S and the drain electrode 25D have an aperture 27 to expose the oxide semiconductor layer 23. Thereby, in the TFT 20, oxygen is easily supplied to the oxide semiconductor layer 23, and is able to restore favorable transistor characteristics.

The aperture 27 may be provided in one of the source electrode 25S and the drain electrode 25D. Further, the dimension of the aperture 27, the shape thereof, and the number thereof are not particularly limited. For example, the aperture 27 having dimensions of 5 nm*5 nm may be arranged in four locations on one side.

The source electrode 25S and the drain electrode 25D include, for example, a metal layer containing aluminum, copper, silver, or molybdenum as a main component. The source electrode 25S and the drain electrode 25D are preferably made of a single layer film of the metal layer, or a laminated film composed of the metal layer and a metal layer or metal compound layer containing titanium, vanadium, niobium, tantalum, chromium, tungsten, nickel, zinc, or indium as a main component.

In particular, the source electrode 25S and the drain electrode 25D preferably include a metal layer containing aluminum or copper as a main component, since thereby resistance of the wirings is able to be lowered. Examples of metals having aluminum as a main component include aluminum, an aluminum-neodymium alloy, and aluminum containing silicon.

Further, a layer contacted with the oxide semiconductor layer 23 of the source electrode 25S and the drain electrode 25D is preferably composed of a metal that does not make oxygen detached from the oxide semiconductor layer 23 or a metal compound that does not make oxygen detached from the oxide semiconductor layer 23, since with the use of such a metal or such a metal compound, there is a small possibility to change the electric characteristics of the TFT 20. Specifically, the layer contacted with the oxide semiconductor layer 23 of the source electrode 25S and the drain electrode 25D is preferably composed of molybdenum; an oxide, a nitride, or a nitroxide of molybdenum or titanium; an aluminum nitride; or a copper oxide.

The uppermost layer of the source electrode 25S and the drain electrode 25D is preferably composed of titanium; or an oxide, a nitride, or a nitroxide of titanium.

As a specific structural example of the source electrode 25S and the drain electrode 25D, for example, a laminated film in which a molybdenum layer 25A having a thickness of 50 nm, an aluminum layer 25B having a thickness of 50 nm, and a titanium layer 25C having a thickness of 50 nm are layered from the oxide semiconductor layer 23 side is preferable for the following reason. In the case where an anode 52 of the organic light emitting devices 10R, 10G, and 10B described later is composed of a metal containing aluminum as a main component, the anode 52 should be provided with wet etching by using a mixed solution containing phosphoric acid, nitric acid, acetic acid or the like. At this time, the titanium layer 25C as the uppermost layer has a significantly low etching rate, and thus the titanium layer 25C is able to be left on the substrate 10 side. As a result, a cathode 55 of the organic light emitting devices 10R, 10G, and 10B described later is allowed to be connected to the titanium layer 25C on the substrate 10 side.

Otherwise, the layer contacted with the oxide semiconductor layer 23 of the source electrode 25S and the drain electrode 25D is preferably composed of a metal oxide or a metal nitride. Examples of metal oxides include titanium oxide, niobium oxide, zinc oxide, tin oxide, and ITO (indium tin composite oxide). Examples of metal nitrides include titanium nitride and tantalum nitride.

The passivation film 26 has, for example, a thickness of about 300 nm, and is made of a silicon oxide film, a silicon nitride film, a silicon oxynitride film, an aluminum oxide film, or a laminated film thereof.

Figure 5:
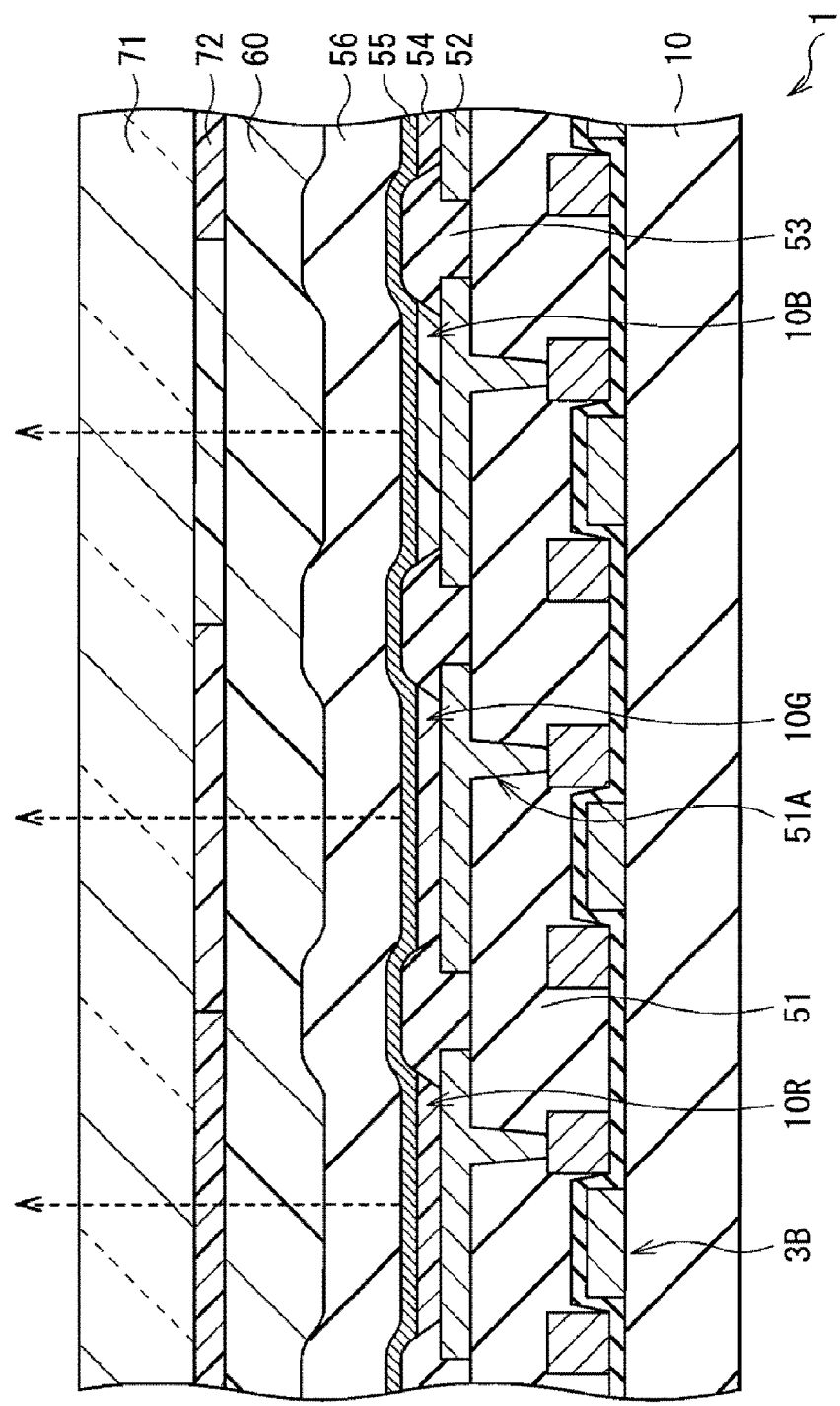
FIG. 5 is a cross sectional view illustrating a structure of the display region illustrated in FIG. 1.

FIG. 5 illustrates a cross sectional structure of the display region 110. In the display region 110, the organic light emitting device 10R generating red light, the organic light emitting device 10G generating green light, and the organic light emitting device 10B generating blue light are sequentially formed in a matrix state as a whole. The organic light emitting devices 10R, 10G, and 10B have a reed-like planar shape, and a combination of the organic light emitting devices 10R, 10G, and 10B adjacent to each other composes one pixel.

The organic light emitting devices 10R, 10G, and 10B respectively have a structure in which the anode 52, an interelectrode insulating film 53, an organic layer 54 including an after-mentioned light emitting layer, and the cathode 55 are layered in this order over the TFT substrate 1 with a planarizing insulating film 51 in between.

The organic light emitting devices 10R, 10G, and 10B as above are coated with a protective film 56 composed of silicon nitride (SiN), silicon oxide (SiO) or the like according to needs. Further, a sealing substrate 71 made of glass or the like is bonded to the whole area of the protective film 56 with an adhesive layer 60 made of a thermoset resin, an ultraviolet curable resin or the like in between, and thereby the organic light emitting devices 10R, 10G, and 10B are sealed. The sealing substrate 71 may be provided with a color filter 72 and a light shielding film (not illustrated) as a black matrix according to needs.

The planarizing insulating film 51 is intended to planarize a front face of the TFT substrate 1 over which the pixel circuit 140 including the sampling transistor 3A and the drive transistor 3B composed of the foregoing TFT 20 is formed. Since a fine connection hole 51A is formed in the planarizing insulating film 51, the planarizing insulating film 51 is preferably made of a material having favorable pattern precision. Examples of materials of the planarizing insulating film 51 include an organic material such as polyimide and an inorganic material such as silicon oxide ($SiO_2$). The drive transistor 3B illustrated in FIG. 2 is electrically connected to the anode 52 through the connection hole 51A provided in the planarizing insulating film 51.

The anode 52 is formed correspondingly to the respective organic light emitting devices 10R, 10G, and 10B. Further, the anode 52 has a function as a reflecting electrode to reflect light generated in the light emitting layer, and desirably has high reflectance as much as possible in order to improve light emitting efficiency. The anode 52 has, for example, a thickness from 100 nm to 1000 nm both inclusive. The anode 52 is composed of a simple substance or an alloy of a metal element such as silver (Ag), aluminum (Al), chromium (Cr), titanium (Ti), iron (Fe), cobalt (Co), nickel (Ni), molybdenum (Mo), copper (Cu), tantalum (Ta), tungsten (W), platinum (Pt), and gold (Au).

The interelectrode insulating film 53 is intended to secure insulation between the anode 52 and the cathode 55, and to accurately obtain a desired shape of the light emitting region. For example, the interelectrode insulating film 53 is made of an organic material such as polyimide or an inorganic insulating material such as silicon oxide ($SiO_2$). The interelectrode insulating film 53 has apertures correspondingly to the light emitting region of the anode 52. The organic layer 54 and the cathode 55 may be also provided continuously on the interelectrode insulating film 53 in addition to on the light emitting region, but light is emitted only in the aperture of the interelectrode insulating film 53.

The organic layer 54 has, for example, a structure in which a hole injection layer, a hole transport layer, the light emitting layer, and an electron transport layer (not illustrated) are layered sequentially from the anode 52 side. Of the foregoing layers, the layers other than the light emitting layer may be provided according to needs. Further, the organic layer 54 may have a structure varying according to the light emitting color of the organic light emitting devices 10R, 10G, and 10B. The hole injection layer is intended to improve the electron hole injection efficiency and functions as a buffer layer to prevent leakage. The hole transport layer is intended to improve efficiency to transport electron hole into the light emitting layer. The light emitting layer is intended to generate light due to electron-hole recombination by impressing an electric field. The electron transport layer is intended to improve efficiency to transport electrons into the light emitting layer. The materials of the organic layer 54 are not particularly limited as long as the materials are a general low molecular organic material or a general high molecular organic material.

The cathode 55 has, for example, a thickness from 5 nm to 50 nm both inclusive, and is composed of a simple substance or an alloy of metal elements such as aluminum (Al), magnesium (Mg), calcium (Ca), and sodium (Na). Specially, an alloy of magnesium and silver (MgAg alloy) or an alloy of aluminum (Al) and lithium (Li) (AlLi alloy) is preferable. Further, the cathode 55 may be composed of ITO or IZO (indium zinc composite oxide).

The display unit may be manufactured, for example, as follows.

Step of Forming TFT Substrate 1

Figure 6A:
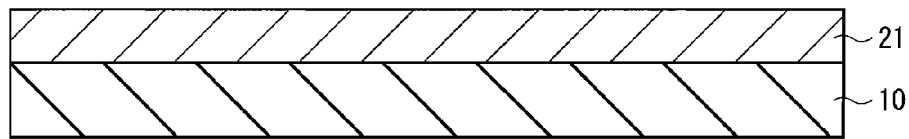
FIG. 6A to 6D are cross sectional views illustrating a method of manufacturing the display unit illustrated in FIG. 1 in the order of steps.

First, as illustrated in FIG. 6A, a metal layer that has the foregoing thickness and is made of the foregoing material is formed on the substrate 10 made of glass by, for example, sputtering method. Photolithography and etching are provided for the metal layer, and thereby the gate electrode 21 is formed.

Figure 6B:
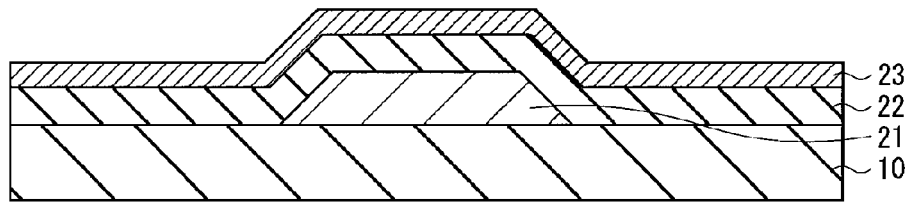

Next, as illustrated in FIG. 6B, the gate insulating film 22 that has the foregoing thickness and is made of the foregoing material is formed on the whole area of the substrate 10 by, for example, plasma CVD (Chemical Vapor Deposition) method.

Subsequently, again as illustrated in FIG. 6B, the oxide semiconductor layer 23 that has the foregoing thickness and is made of the foregoing material is formed by sputtering method. Specifically, in the case where the oxide semiconductor layer 23 is composed of indium gallium zinc oxide (IGZO), for example, with the use of DC sputtering method in which IGZO ceramics is used as a target, an IGZO film is formed on the substrate 10 by plasma discharge by mixed gas of argon (Ar) and oxygen ($O_2$). Before plasma discharge, air is exhausted until the vacuum degree in a vacuum container becomes equal to or less than $1*10^{-4}$ Pa, and then the mixed gas of argon and oxygen is introduced. In the case where the oxide semiconductor layer 23 is composed of zinc oxide, with the use of RF sputtering method in which zinc oxide ceramics is used as a target or with the use of DC sputtering method in which zinc metal target is used in gas atmosphere containing argon and oxygen, a zinc oxide film is formed.

Figure 6C:
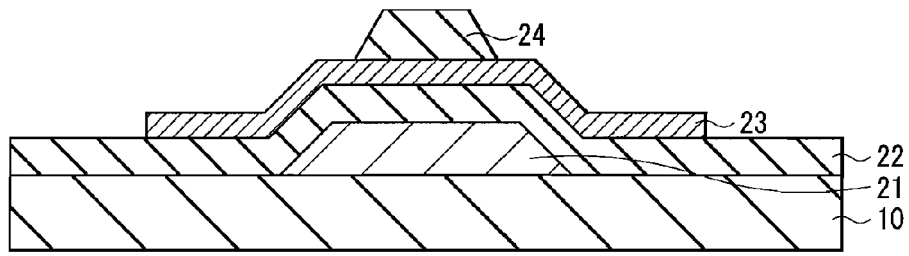

After that, as illustrated in FIG. 6C, the oxide semiconductor layer 23 is formed into a given shape by photolithography and etching. Subsequently, again as illustrated in FIG. 6C, the channel protective layer 24 that has the foregoing thickness and is made of the foregoing material is formed by, for example, plasma CVD method. The channel protective layer 24 is formed into a given shape by photolithography and etching.

Figure 6D:
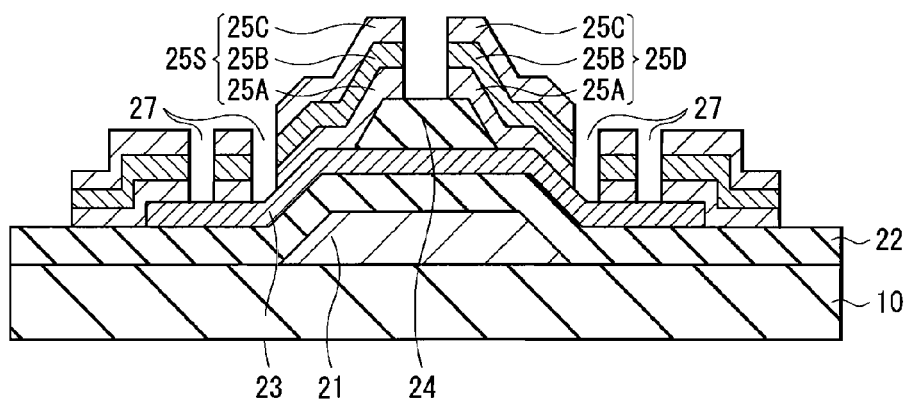

After the channel protective layer 24 is formed, for example, by sputtering method, the molybdenum layer 25A having a thickness of 50 nm, the aluminum layer 25B having a thickness of 50 nm, and the titanium layer 25C having a thickness of 50 nm are formed. Subsequently, after the titanium layer 25C is etched by dry etching with the use of chlorine-based gas, the aluminum layer 25B and the molybdenum layer 25A are etched by wet etching with the use of a mixed solution containing phosphoric acid, nitric acid, and acetic acid. Thereby, as illustrated in FIG. 6D, the source electrode 25S and the drain electrode 25D having the aperture 27 are formed.

After the source electrode 25S and the drain electrode 25D are formed, oxygen annealing is provided under high temperature, and thereby oxygen is supplied to an absent portion in which oxygen is lacked or oxygen is detached in the oxide semiconductor layer 23 to restore the characteristics. As annealing conditions, for example, annealing in the atmosphere in which the nitrogen concentration is 60% and the oxygen concentration is 40% at 300 deg C. in 1 hour may be adopted. In this case, the aperture 27 is provided in the source electrode 25S and the drain electrode 25D, and the oxide semiconductor layer 23 is exposed in the aperture 27. Thus, oxygen is easily supplied from the aperture 27 to the oxygen absent portion in the oxide semiconductor layer 23. Further, oxygen is also easily supplied from the exposed portion 23B of the oxide semiconductor layer 23 to the oxide semiconductor layer 23.

After that, the passivation film 26 that has the foregoing thickness and is made of the foregoing material is formed by atomic layer deposition method or sputtering method. Accordingly, the TFT substrate 1 having the TFT 20 illustrated in FIG. 3 and FIG. 4 is formed.

Figure 7A:
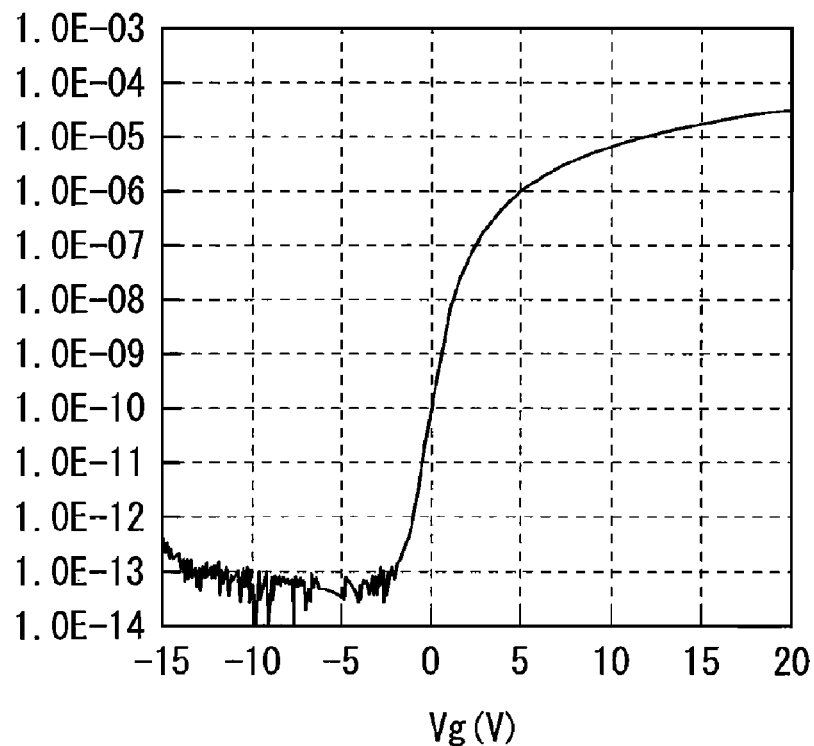
FIGS. 7A and 7B are diagrams for explaining characteristics of the TFT illustrated in FIG. 3.

The TFT 20 was actually fabricated by forming the source electrode 25S and the drain electrode 25D as a laminated film composed of the molybdenum layer 25A having a thickness of 50 nm, the aluminum layer 25B having a thickness of 500 nm, and the titanium layer 25C having a thickness of 50 nm, and annealing the resultant film under the foregoing annealing conditions. For the obtained TFT 20, transfer characteristics were examined. In the result, as illustrated in FIG. 7A, transistor characteristics in which on/off ratio was sufficiently secured were obtained.

Figure 7B:
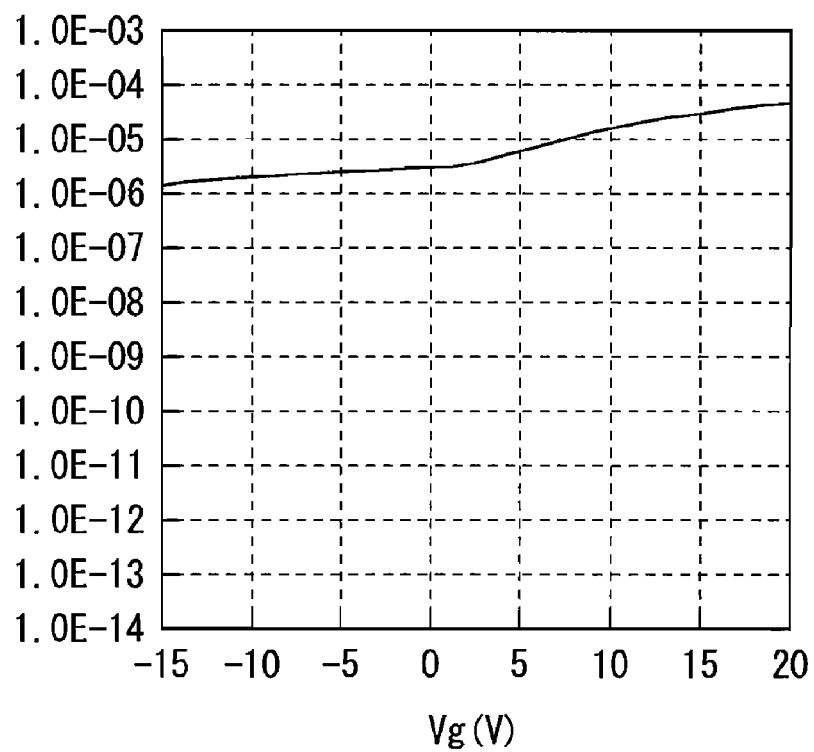

Meanwhile, a TFT was fabricated in the same manner as the foregoing manner, except that a titanium layer was used instead of the molybdenum layer 25A. For the obtained TFT, the transfer characteristics were examined. In the result, as illustrated in FIG. 7B, transistor characteristics in which on/off ratio was sufficiently secured were not obtained.

The reason of the foregoing result may be as follows. In the case where the source electrode 25S and the drain electrode 25D are formed as a three-layer film composed of titanium, aluminum, and titanium, titanium is hardly wet-etched and thus dry etching is generally used. To obtain favorable TFT characteristics, the thickness of the oxide semiconductor layer 23 should be about 50 nm. However, in the case of using dry etching, the selection ratio between the metal material composing the source electrode 25S and the drain electrode 25D and the oxide semiconductor is difficult to increase. Thus, in etching the source electrode 25S and the drain electrode 25D, the oxide semiconductor layer 23 is eliminated. Therefore, the oxide semiconductor layer 23 is not exposed in the aperture 27, and oxygen is difficult to be supplied into the oxide semiconductor layer 23 even if oxygen annealing is performed.

Step of Forming Organic Light Emitting Devices 10R, 10G, and 10B

After the TFT substrate 1 is formed, the whole area of the TFT substrate 1 is coated with a photosensitive resin, and exposure and development are performed. Thereby, the planarizing insulating film 51 and the connection hole 51A are formed and fired. Next, the anode 52 made of the foregoing material is formed by, for example, direct current sputtering. The resultant film is selectively etched and patterned into a given shape by, for example, using lithography technique. Subsequently, the interelectrode insulating film 53 that has the foregoing thickness and is made of the foregoing material is formed by, for example, CVD method, and an aperture is formed by using, for example, lithography technique. After that, the organic layer 54 and the cathode 55 that are made of the foregoing materials are sequentially formed by, for example, evaporation method to form the organic light emitting devices 10R, 10G, and 10B. Subsequently, the organic light emitting devices 10R, 10G, and 10B are covered with the protective film 56 made of the foregoing material.

After that, the adhesive layer 60 is formed on the protective film 56. After that, the sealing substrate 71 that is provided with the color filter 72 and is made of the foregoing material is prepared. The TFT substrate 1 and the sealing substrate 71 are bonded to each other with the adhesive layer 60 in between. Accordingly, the display unit illustrated in FIG. 5 is completed.

In this display unit, the sampling transistor 3A makes conduction in accordance with a control signal supplied from the scanning line WSL, a signal potential of a video signal supplied from the signal line DTL is sampled and retained in the retentive capacity 3C. Further, a current is supplied from the power source line DSL in the first potential to the drive transistor 3B, and a drive current is supplied to the light emitting device 3D (organic light emitting devices 10R, 10G, and 10B) in accordance with the signal potential retained in the retentive capacity 3C. The light emitting device 3D (organic light emitting devices 10R, 10G, and 10B) emits light at luminance corresponding to the signal potential of the video signal by the supplied drive current. The light is transmitted through the cathode 55, the color filter 72, and the sealing substrate 71 and is extracted.

In this case, in the TFT 20 configuring the sampling transistor 3A and the drive transistor 3B, the aperture 27 to expose the oxide semiconductor layer 23 is provided in the source electrode 25S and the drain electrode 25D. Thus, by oxygen annealing in the manufacturing step, oxygen is supplied from the aperture 27 to the absent portion in which oxygen is lacked or oxygen is detached in the oxide semiconductor layer 23, and transistor characteristics are sufficiently restored. Accordingly, in the display unit configured by using the TFT 20, low resistance of the oxide semiconductor layer 23 of the TFT 20 is suppressed, the leakage current is suppressed, and light display with high luminance is enabled.

As described above, in this embodiment, the aperture 27 to expose the oxide semiconductor layer 23 is provided in the source electrode 25S and the drain electrode 25D of the TFT 20. Thus, oxygen is easily supplied from the aperture 27 to the oxide semiconductor layer 23, and favorably transistor characteristics are able to be restored. Accordingly, when a display unit is configured by using the TFT 20, low resistance of the oxide semiconductor layer 23 of the TFT 20 is suppressed and thus the leakage current is able to be suppressed, and light display with high luminance is enabled.

Descriptions will be hereinafter given of Modified examples 1-1 to 1-5 of this embodiment. In an actual pixel layout, in some cases, it is difficult to provide the aperture 27 in the source electrode 25S or the drain electrode 25D in the line and space process. The following modified examples are able to resolve such a disadvantage.

Modified Example 1-1

Figure 8:
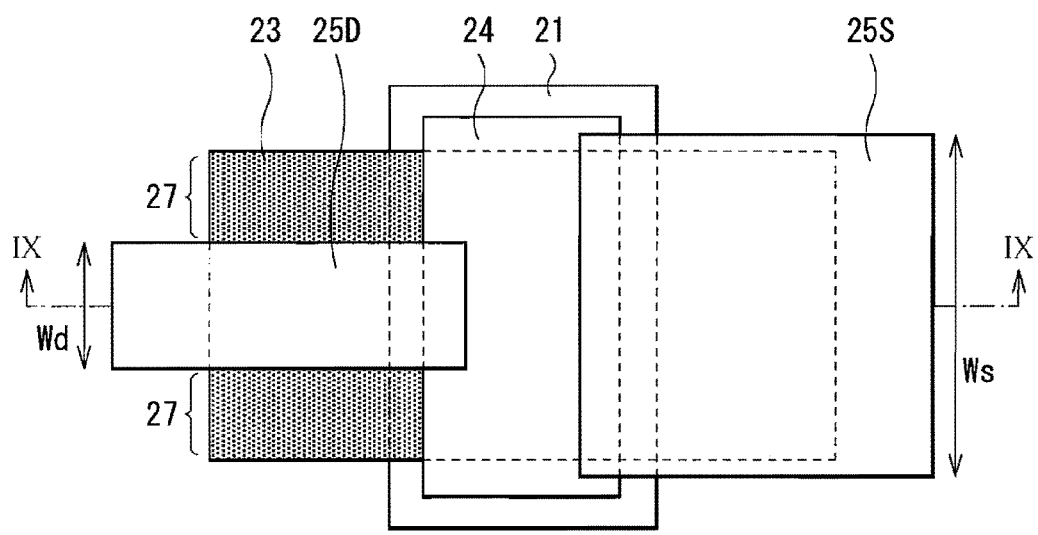
FIG. 8 is a plan view illustrating a structure of a TFT according to Modified example 1-1.
Figure 9:
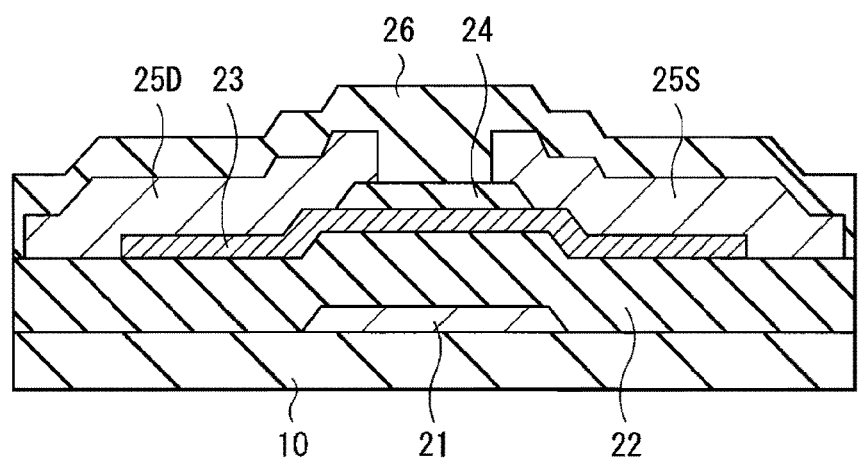
FIG. 9 is a cross sectional view illustrating a structure of the TFT illustrated in FIG. 8.

FIG. 8 illustrates a planar structure of the TFT 20 according to Modified example 1-1. FIG. 9 illustrates a cross sectional structure taken along line IX-IX of FIG. 8. In the TFT 20, a channel width Wd of the drain electrode 25D is different from a channel width Ws of the source electrode 25S, and the aperture 27 to expose the oxide semiconductor layer 23 is provided on both sides in the channel width direction of one of the source electrode 25S and the drain electrode 25D. Thereby, in the TFT 20, oxygen is easily supplied to the oxide semiconductor layer 23, and favorable transistor characteristics are able to be restored.

Specifically, it is preferable that the channel width Ws of the source electrode 25S is larger than the channel width Wd of the drain electrode 25D, and the aperture 27 is provided on both sides in the channel width direction of the drain electrode 25D. If the aperture 27 is provided in the source electrode 25S, it is difficult to sufficiently secure the retentive capacity 3C.

Figure 10:
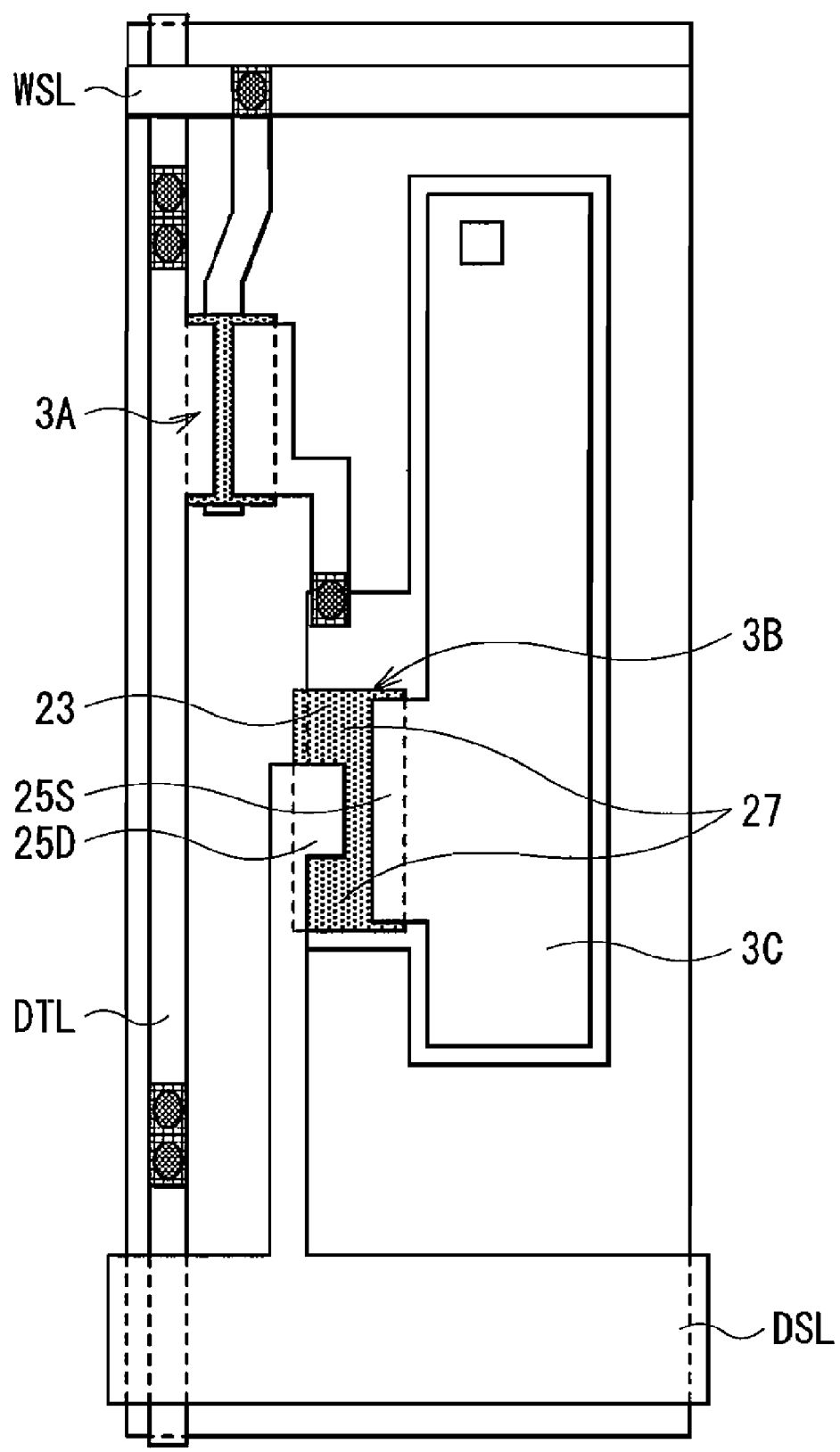
FIG. 10 is a plan view illustrating a configuration of a pixel circuit including the TFT illustrated in FIG. 8.

FIG. 10 illustrates a planar structure of the pixel circuit 140 using the TFT 20 illustrated in FIG. 8 and FIG. 9. The TFT 20 is applicable to both the sampling transistor 3A and the drive transistor 3B, but in particular, is preferably applied to the drive transistor 3B, since the drive transistor 3B has a large transistor size.

Modified Example 1-2

Figure 11:
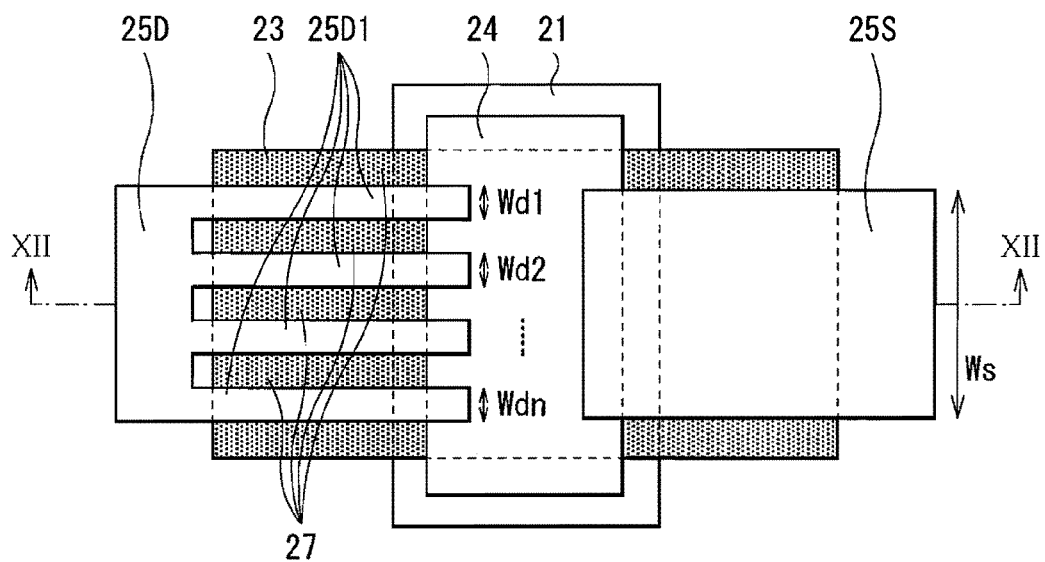
FIG. 11 is a plan view illustrating a structure of a TFT according to Modified example 1-2.
Figure 12:
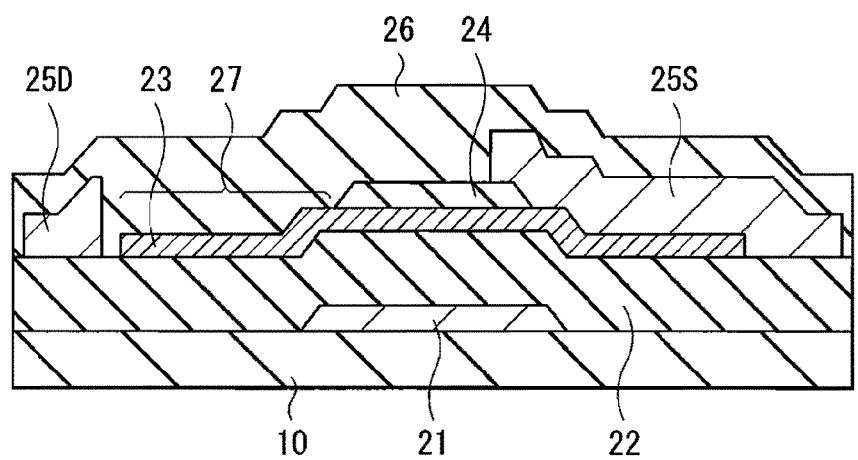
FIG. 12 is a cross sectional view illustrating a structure of the TFT illustrated in FIG. 11.

FIG. 11 illustrates a planar structure of the TFT 20 according to Modified example 1-2. FIG. 12 illustrates a cross sectional structure taken along line XII-XII of FIG. 11. In the TFT 20, one of the drain electrode 25D and the source electrode 25S is in the shape of a nozzle or in the shape of tooth. The aperture 27 to expose the oxide semiconductor layer 23 is provided between each teeth of the comb. Thereby, in the TFT 20, oxygen is easily supplied to the oxide semiconductor layer 23, and favorable transistor characteristics are able to be restored.

Specifically, it is preferable that the drain electrode 25D is in the shape of a nozzle or in the shape of a comb having many teeth 25D1, and the aperture 27 is provided between the respective teeth 25D1 of the drain electrode 25D. If the aperture 27 is provided in the source electrode 25S, it is difficult to sufficiently secure the retentive capacity 3C. Further, the channel width Wd of the drain electrode 25D is equal to the total of each width of the respective teeth 25D1 (Wd=Wd1+ Wd2+ ... Wdn). The channel width Ws of the source electrode 25S is larger than the channel width Wd of the drain electrode 25D.

Figure 13:
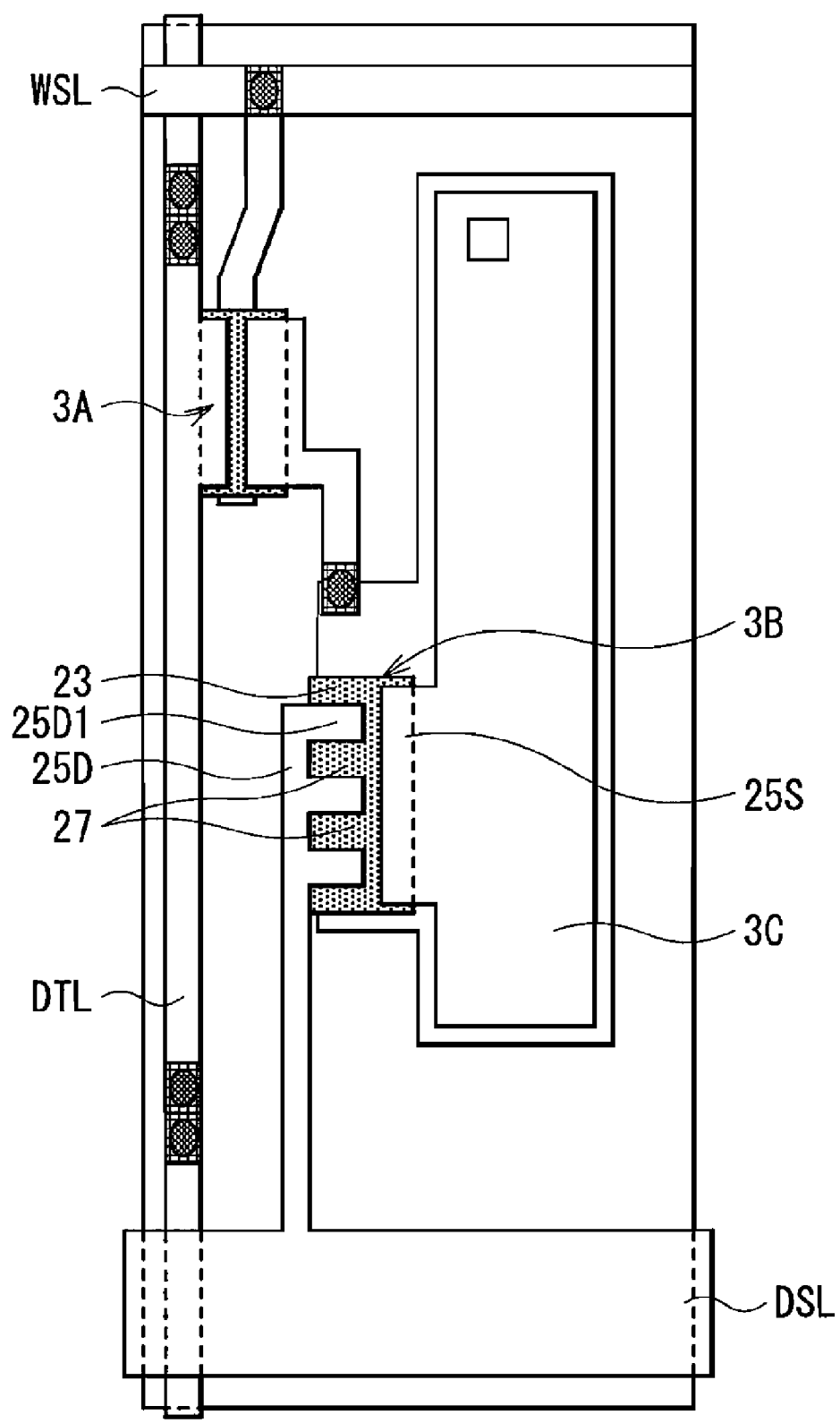
FIG. 13 is a plan view illustrating a configuration of a pixel circuit including the TFT illustrated in FIG. 11.

FIG. 13 illustrates a planar structure of the pixel circuit 140 using the TFT 20 illustrated in FIG. 11 and FIG. 12. The TFT 20 is applicable to both the sampling transistor 3A and the drive transistor 3B, but in particular, is preferably applied to the drive transistor 3B, since the drive transistor 3B has a large transistor size.

Modified Example 1-3

Figure 14:
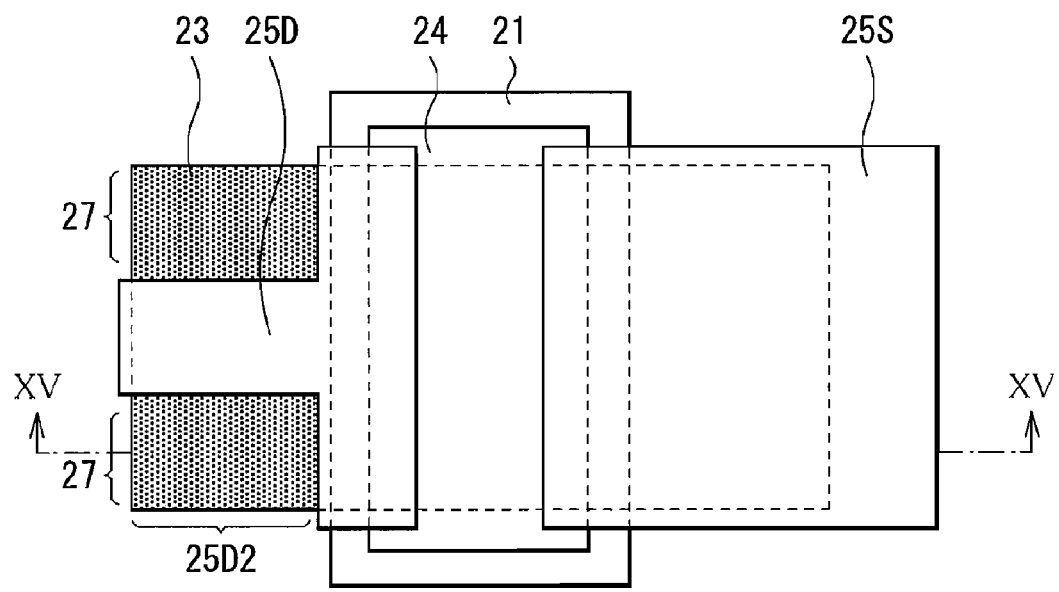
FIG. 14 is a plan view illustrating a structure of a TFT according to Modified example 1-3.
Figure 15:
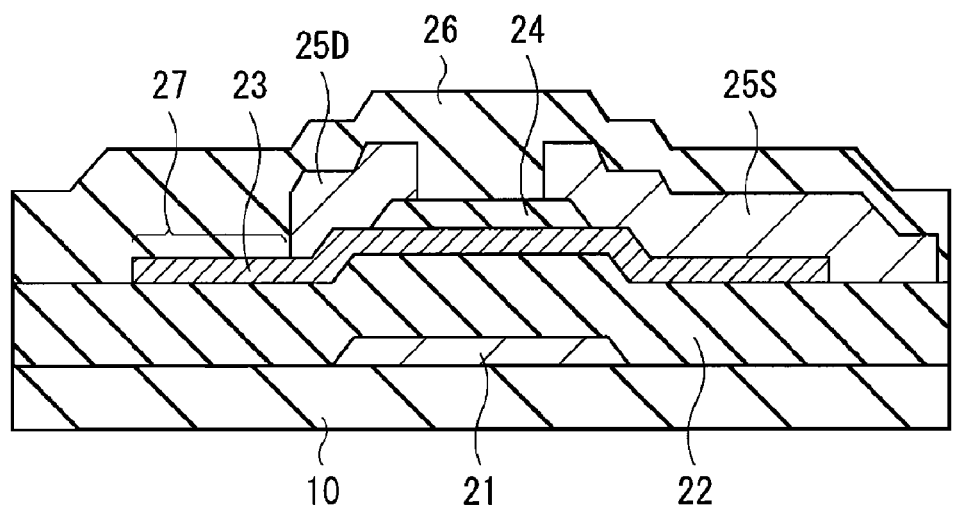
FIG. 15 is a cross sectional view illustrating a structure of the TFT illustrated in FIG. 14.

FIG. 14 illustrates a planar structure of the TFT 20 according to Modified example 1-3. FIG. 15 illustrates a cross sectional structure taken along line XV-XV of FIG. 14. In the TFT 20, a narrow channel width region 25D2 in which the channel width is decreased is provided in the drain electrode 25D. The aperture 27 to expose the oxide semiconductor layer 23 is provided in the narrow channel width region 25D2. Thereby, in the TFT 20, oxygen is easily supplied to the oxide semiconductor layer 23, and favorable transistor characteristics are able to be restored.

In this case, it is more preferable that the narrow channel width region 25D2 and the aperture 27 are provided in part of the drain electrode 25D than that the narrow channel width region is provided in part of the source electrode 25S. If the aperture 27 is provided in the source electrode 25S, it is difficult to sufficiently secure the retentive capacity 3C.

Figure 16:
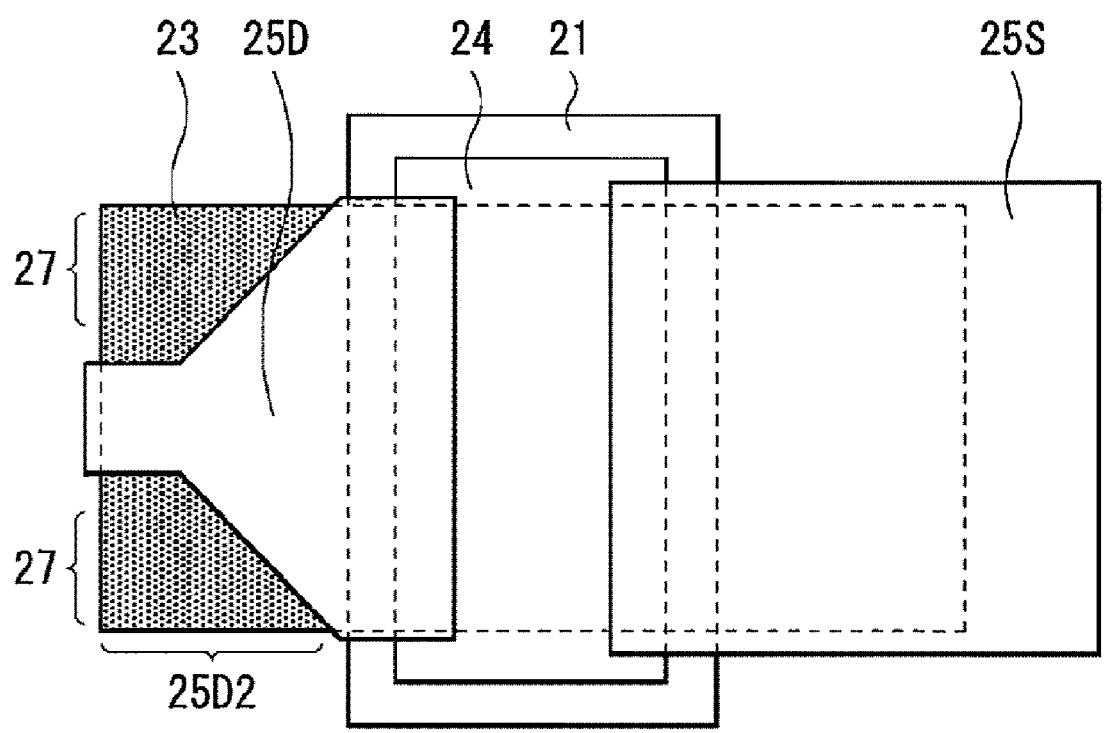
FIG. 16 is a plan view illustrating a modified example of the TFT illustrated in FIG. 14.

The planar shape of the narrow channel width region 25D2 is not limited to a rectangle as illustrated in FIG. 14, but may be a tapered shape in which the width is narrowed as the position thereof becomes apart from the source electrode 25S such as a trapezoid, as illustrated in FIG. 16.

Figure 17:
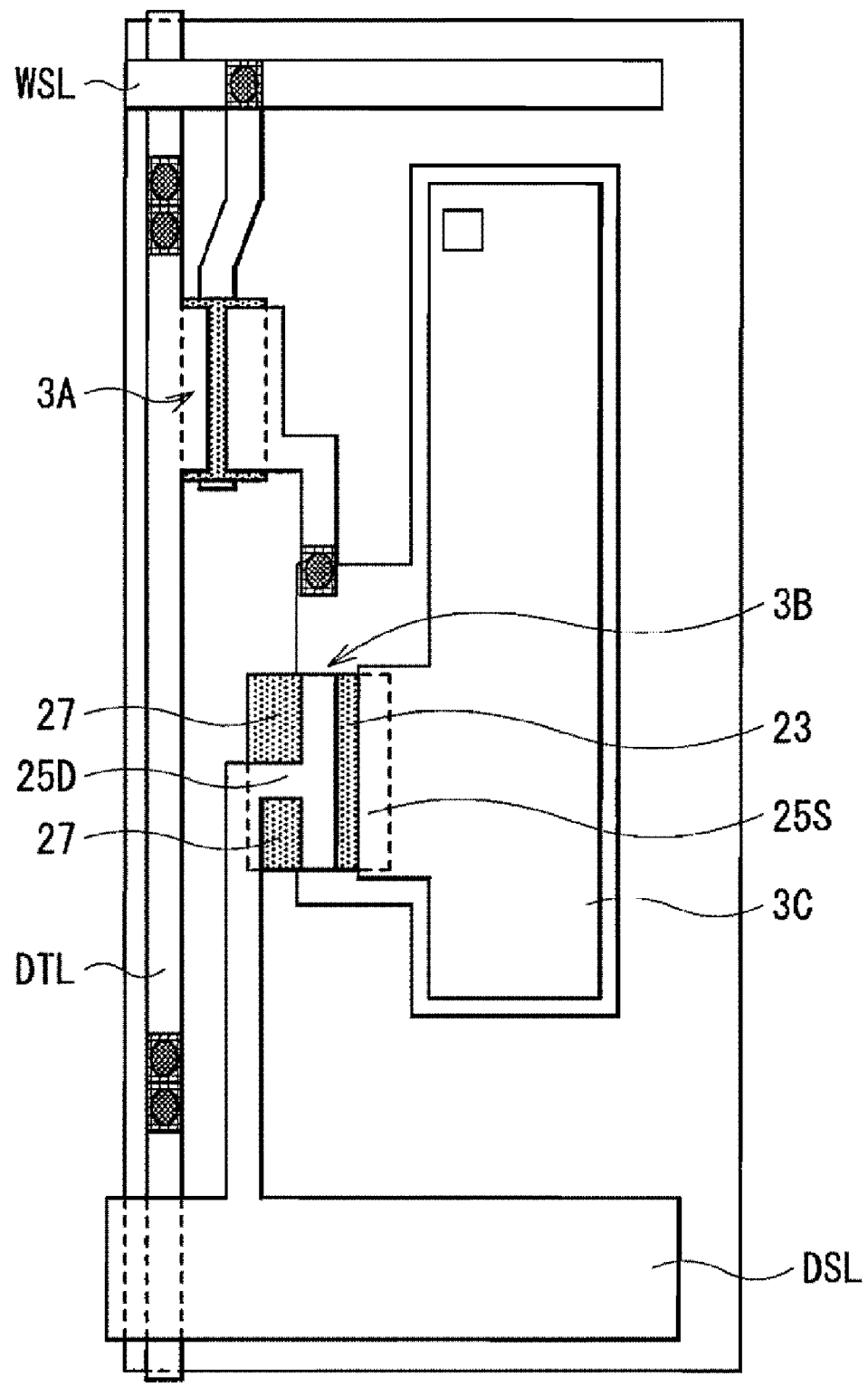
FIG. 17 is a plan view illustrating a configuration of a pixel circuit including the TFT illustrated in FIG. 14.

FIG. 17 illustrates a planar structure of the pixel circuit 140 using the TFT 20 illustrated in FIG. 14 and FIG. 15. The TFT 20 is applicable to both the sampling transistor 3A and the drive transistor 3B, but in particular, is preferably applied to the drive transistor 3B, since the drive transistor 3B has a large transistor size.

Modified Example 1-4

Figure 18:
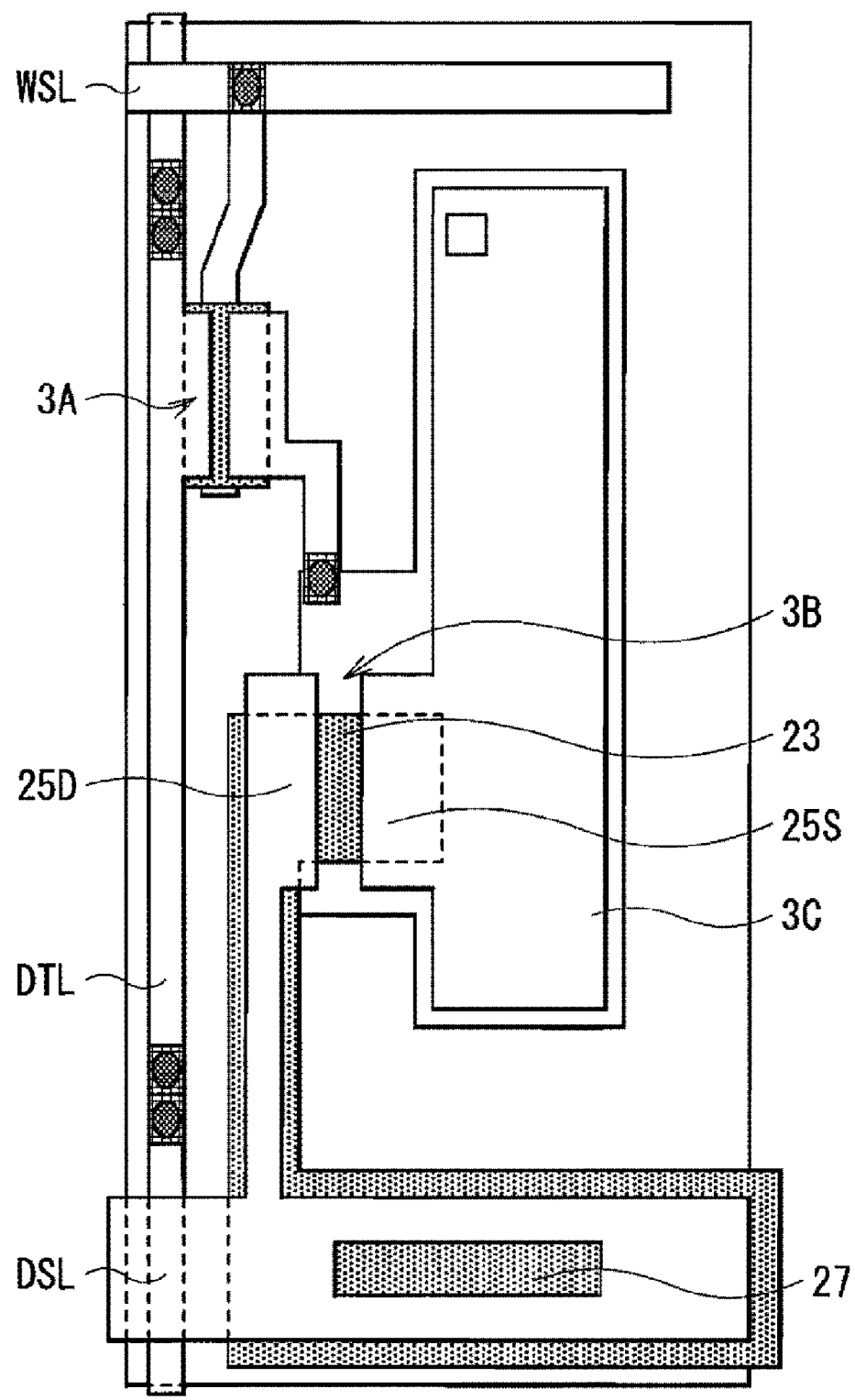
FIG. 18 is a plan view illustrating a configuration of a pixel circuit according to Modified example 1-4.
Figure 19:
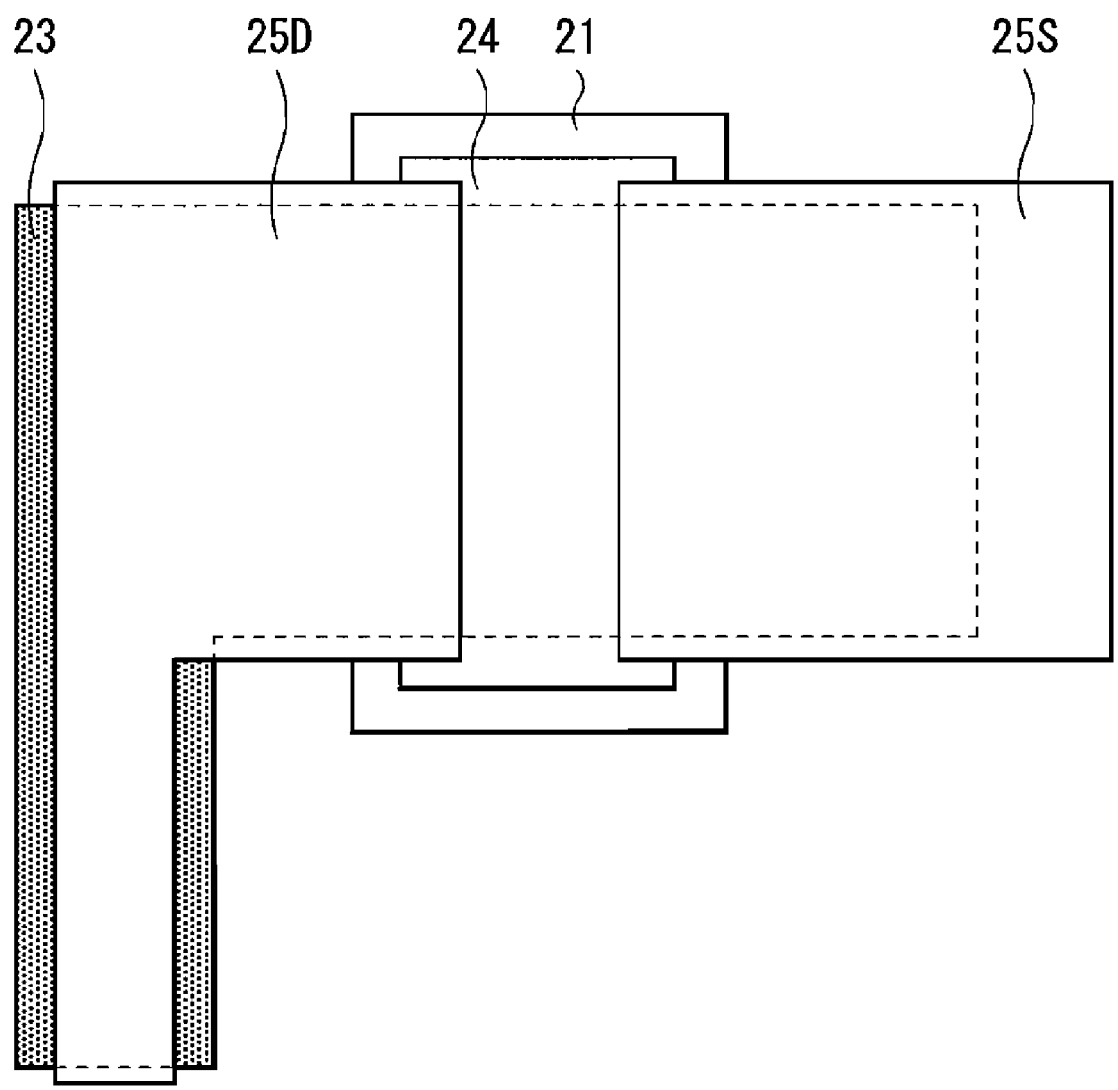
FIG. 19 is a plan view illustrating an enlarged configuration of the drive transistor illustrated in FIG. 18.

FIG. 18 illustrates a planar structure of the pixel circuit 140 according to Modified example 1-4. FIG. 19 illustrates an enlarged planar structure of the drive transistor 3B illustrated in FIG. 18. In the pixel circuit 140 and the drive transistor 3B, the oxide semiconductor layer 23 extends from a section below the drain electrode 25D to a section below the power line DSL. The aperture 27 to expose the oxide semiconductor layer 23 is provided in the power line DSL. Thereby, in the pixel circuit 140, oxygen is easily supplied to the oxide semiconductor layer 23 of the drive transistor 3B, and favorable transistor characteristics are able to be restored.

The modified example is applicable to both the sampling transistor 3A and the drive transistor 3B, but in particular, is preferably applied to the drive transistor 3B, since the drive transistor 3B has a large transistor size. Further, since the power line DSL has a large line width, the aperture 27 is more suitably provided in the power line DSL than in the scanning line WSL and the signal line DTL.

Modified Example 1-5

Figure 20:
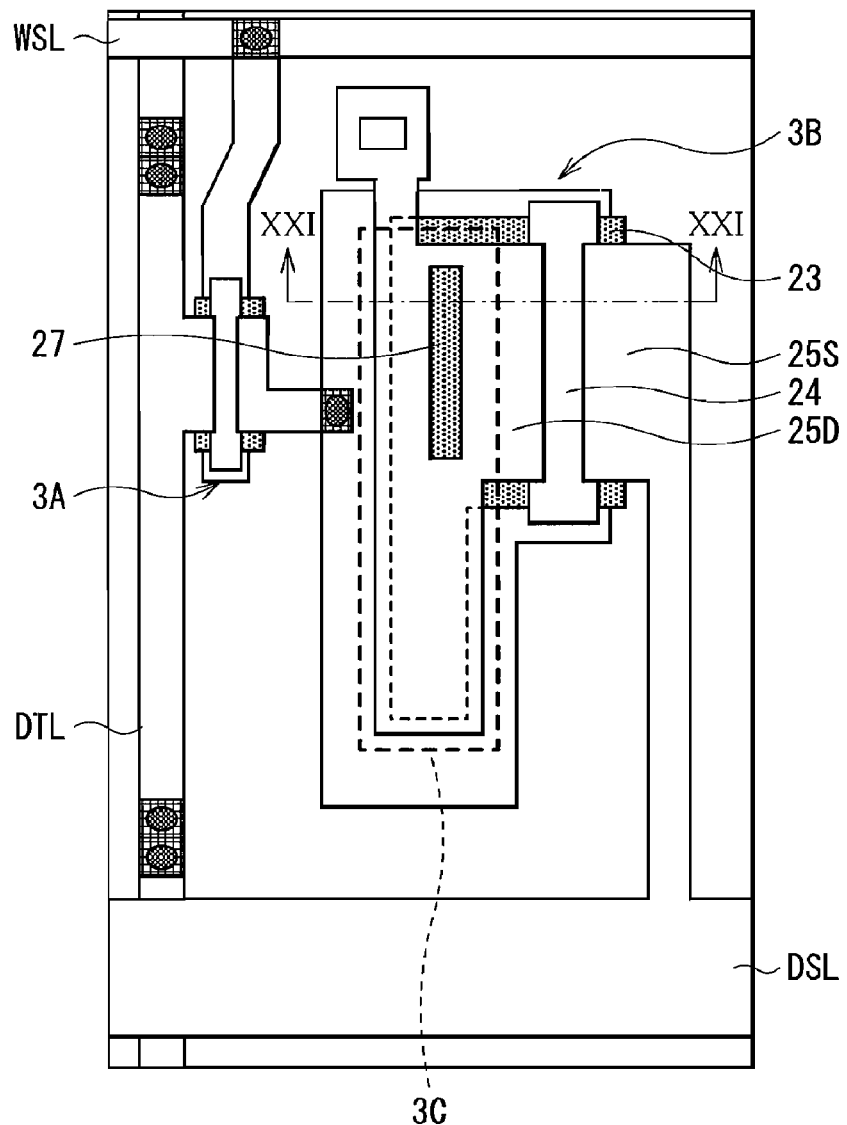
FIG. 20 is a plan view illustrating a configuration of a pixel circuit according to Modified example 1-5.
Figure 21:
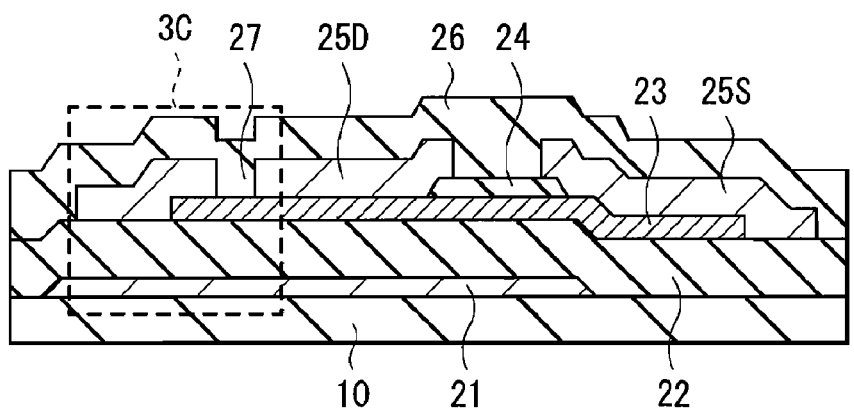
FIG. 21 is a cross sectional view illustrating a configuration of the drive transistor and the retentive capacity illustrated in FIG. 20.

FIG. 20 illustrates a planar structure of the pixel circuit 140 according to Modified example 1-5. FIG. 21 illustrates a cross sectional structure taken along line XXI-XXI of FIG. 20. In the pixel circuit 140 and the drive transistor 3B, the oxide semiconductor layer 23 extends from a section below the drain electrode 25D to a section below the retentive capacity 3C. The aperture 27 to expose the oxide semiconductor layer 23 is provided in the retentive capacity 3C. Thereby, in the pixel circuit 140, oxygen is easily supplied to the oxide semiconductor layer 23 of the drive transistor 3B, and favorable transistor characteristics are able to be restored.

Second Embodiment

Figure 22:
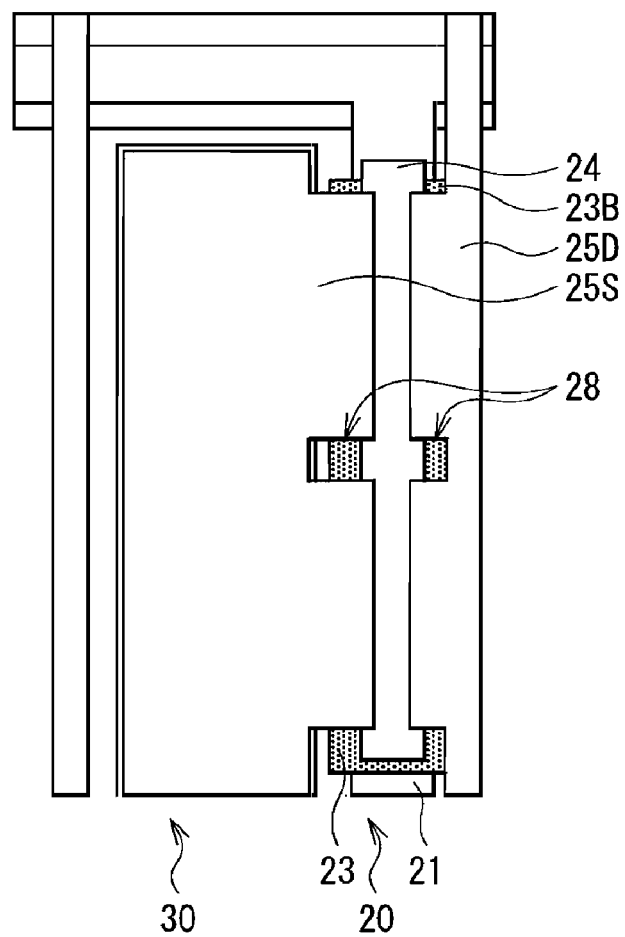
FIG. 22 is a plan view illustrating a structure of a TFT according to a second embodiment of the invention.
Figure 23:
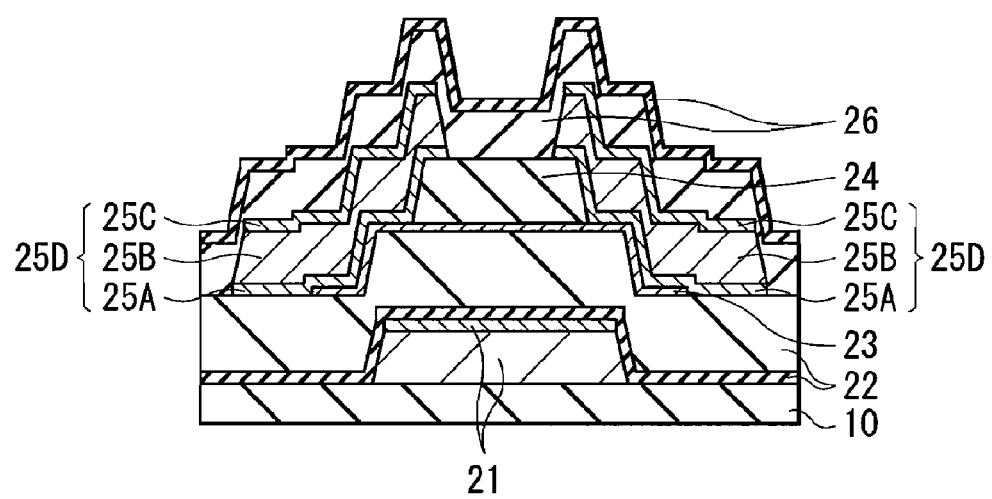
FIG. 23 is a cross sectional view taken along line XXIII-XXIII of FIG. 22.

FIG. 22 illustrates a planar structure of the TFT 20 according to a second embodiment. FIG. 23 illustrates a cross sectional structure taken along line XXIII-XXIII of FIG. 22. In FIG. 22, the TFT 20 configuring the foregoing sampling transistor 3A and a capacitor 30 configuring the foregoing retentive capacity 3C in the pixel circuit 140 of the TFT substrate 1 are illustrated. The TFT 20 is structured in the same manner as that of the foregoing first embodiment, except that the source electrode 25S and the drain electrode 25D are isolated in the channel width direction. Thus, a description will be given by affixing the same referential symbols to the corresponding elements.

The gate electrode 21, the gate insulating film 22, the oxide semiconductor layer 23, the channel protective layer 24, and the passivation film 26 of the TFT 20 are structured in the same manner as that of the first embodiment.

The source electrode 25S and the drain electrode 25D are isolated by a groove 28 in the channel width direction. In the groove 28, the oxide semiconductor layer 23 is exposed. Thereby, in the TFT 20, oxygen is easily supplied to the oxide semiconductor layer 23, and favorable transistor characteristics are able to be restored.

The channel region 23A is preferably formed in a region within 20 μm from the groove 28. Oxygen transfer is transfer in the horizontal direction through in the oxide semiconductor layer 23 or through an interface between the oxide semiconductor layer 23 and other layers. Thus, when the channel region 23A is formed in the region within 20 μm from the groove 28, effect of the groove 28 is able to be further improved.

Figure 24:
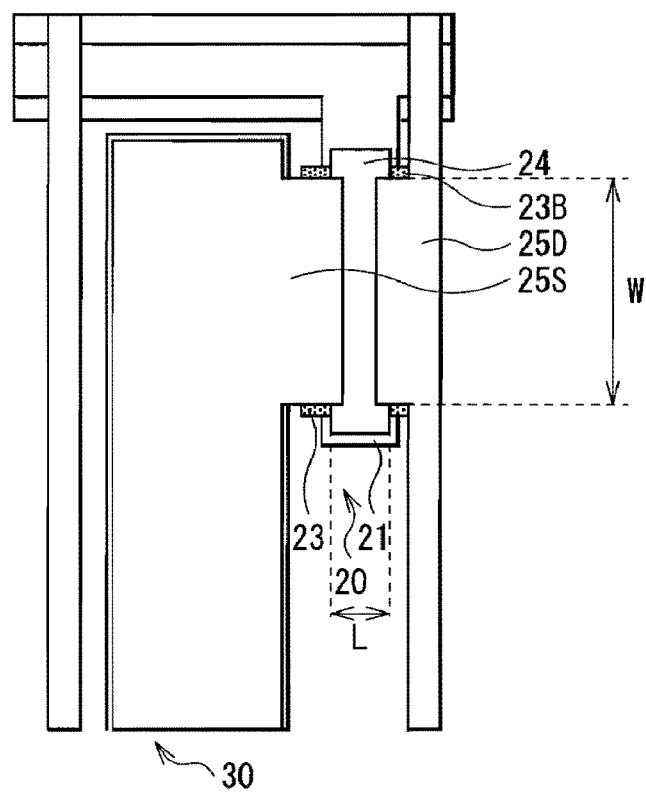
FIG. 24 is a plan view for explaining an oxygen transfer distance in the case of W=20 µm and L=10 µm in Table 1.
Figure 25:
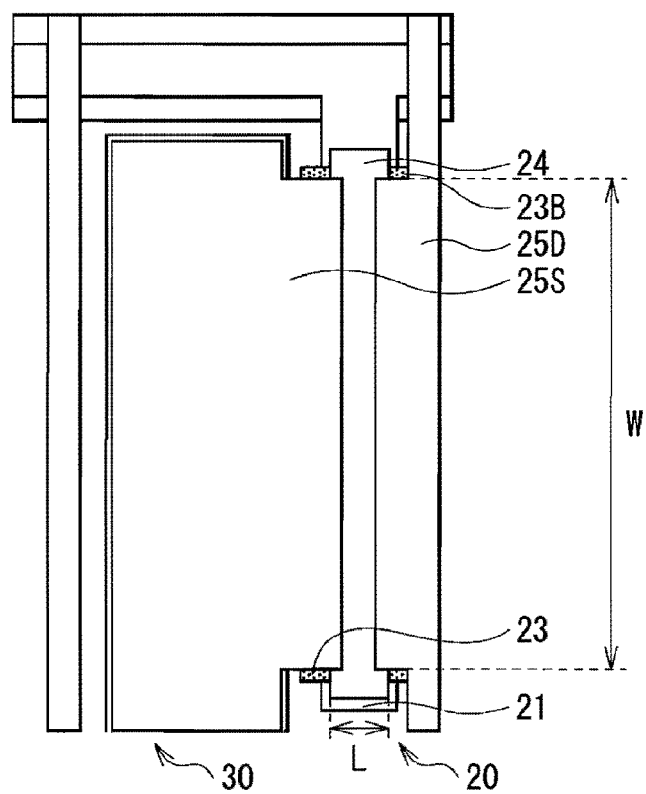
FIG. 25 is a plan view for explaining an oxygen transfer distance in the case of W=50 µm and L=10 µm in Table 1.
Figure 26:
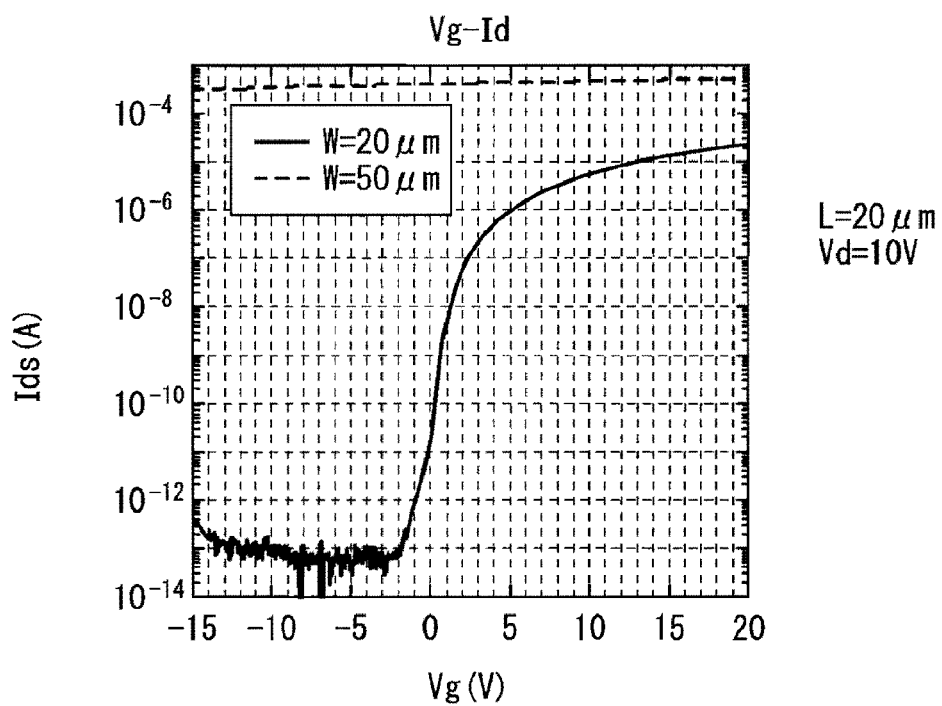
FIG. 26 is a diagram illustrating respective transistor characteristics in the case of W=20 µm and L=20 µm (favorable) and in the case of W=20 µm and L=20 µm (conductor operation) in Table 1.

Table 1 illustrates a result obtained by examining a relation between a channel width W (a width in the direction perpendicular to the direction in which the source electrode 25S and the drain electrode 25D are opposed to each other, that is, a width in the longitudinal direction of the source electrode 25S and the drain electrode 25D) and a channel length L (a width in the direction in which the source electrode 25S and the drain electrode 25D are opposed to each other), and transistor characteristics. As evidenced by Table 1, in the case where W was 20 μm and L was 10 μm as illustrated in FIG. 24, favorable transistor characteristics were shown. Meanwhile, in the case where W was 50 μm and L was 10 μm as illustrated in FIG. 25, depression type operation was shifted to conductor operation. For a reference, in FIG. 26, respective transition characteristics in the case where W was 20 μm and L was 20 μm (favorable) and in the case where W was 20 μm and L was 20 μm (conductor operation) in Table 1 are illustrated.

TABLE 1

| W | L | | |
|---|---|---|---|
|   | 5 | 10 | 20 |
| 10 | Favorable | Favorable | Favorable |
| 20 | Depression type | Favorable | Favorable |
| 50 | Conductor operation | Conductor operation | Conductor operation |

(unit: μm)

In the TFT 20 illustrated in FIG. 24 and FIG. 25, oxygen is supplied only from the exposed portion 23B on both ends in the channel width direction of the oxide semiconductor layer 23. Thus, the oxygen transfer distance becomes W/2. In FIG. 24, the oxygen transfer distance is W/2=10 μm, and favorable transistor characteristics are obtained. Meanwhile, in FIG. 25, the oxygen transfer distance is W/2=25 μm, and the state is shifted to conduction operation. Accordingly, it is found that in the case where the groove 28 is formed, if the oxygen transfer distance is equal to or less than 10 μm, that is, if the channel region 23A is formed in a region within 20 μm from the groove 28, oxygen is able to be sufficiently supplied from the groove 28 and the exposed portion 23B to the oxide semiconductor layer 23.

The capacitor 30 includes a lower layer electrode formed in the same layer as that of the gate electrode 21, a capacitor insulating film formed in the same layer as that of the gate insulating film 22, and an upper layer electrode formed in the same layer as that of the source electrode 25S and the drain electrode 25D sequentially from the substrate 10 side.

The TFT 20 and a display unit including the TFT 20 may be manufactured in the same manner as that of the first embodiment.

In the display unit, as in the first embodiment, a light emitting device 3D (organic light emitting devices 10R, 10G, and 10B) emits light, which is transmitted through the cathode 55, the color filter 72, and the sealing substrate 71 and is extracted. In this case, in the TFT 20 configuring the sampling transistor 3A and the drive transistor 3B, the source electrode 25S and the drain electrode 25D are isolated in the channel width direction by the groove 28 to expose the oxide semiconductor layer 23. Thus, by oxygen annealing in the manufacturing step, oxygen is supplied from the aperture 27 to the absent portion in which oxygen is lacked or oxygen is detached in the oxide semiconductor layer 23, and the transistor characteristics are sufficiently restored. Thus, in the display unit configured by using the TFT 20, low resistance of the oxide semiconductor layer 23 of the TFT 20 is suppressed, the leakage current is suppressed, and light display with high luminance is enabled.

As described above, in this embodiment, the source electrode 25S and the drain electrode 25D are isolated in the channel width direction by the groove 28 to expose the oxide semiconductor layer 23. Thus, oxygen is easily supplied from the groove 28 to the oxide semiconductor layer 23, and favorable transistor characteristics are able to be restored. Accordingly, if the display unit is configured by using the TFT 20, low resistance of the oxide semiconductor layer 23 of the TFT 20 is suppressed and thus the leakage current is able to be suppressed, and light display with high luminance is enabled.

Third Embodiment

Figure 27:
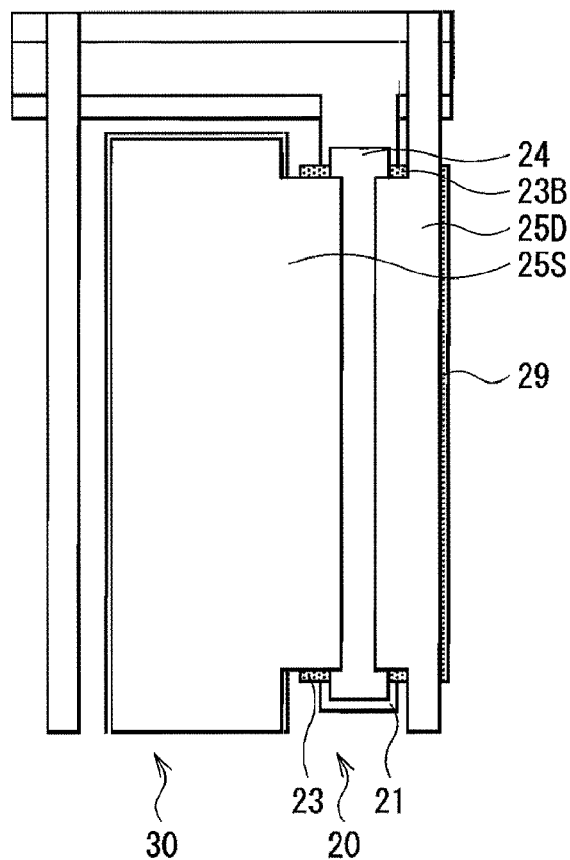
FIG. 27 is a plan view illustrating a structure of a TFT according to a third embodiment of the invention.

FIG. 27 illustrates a planar structure of the TFT 20 according to the third embodiment of the invention. The TFT 20 is structured in the same manner as that of the foregoing first and the second embodiments, except that the oxide semiconductor layer 23 is exposed on one side of the drain electrode 25D. Thus, a description will be given by affixing the same referential symbols to the corresponding elements.

The gate electrode 21, the gate insulating film 22, the oxide semiconductor layer 23, the channel protective layer 24, and the passivation film 26 of the TFT 20 are structured in the same manner as that of the first embodiment.

A protrusion region 29 in which the oxide semiconductor layer 23 is exposed from an end of the drain electrode 25D is provided along a side opposed to a side overlapped with the channel protective layer 24 of the drain electrode 25D. Thereby, in the TFT 20, oxygen is easily supplied to the oxide semiconductor layer 23, and favorable transistor characteristics are able to be restored.

The channel region 23A is preferably formed in a region within 20 μm from the protrusion region 29 as in the second embodiment.

The TFT 20 and a display unit including the TFT 20 may be manufactured in the same manner as that of the first embodiment.

In the display unit, as in the first embodiment, the light emitting device 3D (organic light emitting devices 10R, 10G, and 10B) emits light, which is transmitted through the cathode 55, the color filter 72, and the sealing substrate 71 and is extracted. In this case, in the TFT 20 configuring the sampling transistor 3A and the drive transistor 3B, the protrusion region 29 in which the oxide semiconductor layer 23 is exposed from the end of the drain electrode 25D is provided along the side opposed to the side overlapped with the channel protective layer 24 of the drain electrode 25D. Thus, by oxygen annealing in the manufacturing step, oxygen is supplied to an absent portion in which oxygen is lacked or oxygen is detached in the oxide semiconductor layer 23, and the transistor characteristics are sufficiently restored. Therefore, in the display unit configured by using the TFT 20, low resistance of the oxide semiconductor layer 23 of the TFT 20 is inhibited, the leakage current is suppressed, and light display with high luminance is enabled.

As described above, in this embodiment, since the protrusion region 29 in which the oxide semiconductor layer 23 is exposed from the end of the drain electrode 25D is provided along the side opposed to the side overlapped with the channel protective layer 24 of the drain electrode 25D. Thus, oxygen is able to be easily supplied from the protrusion region 29 to the oxide semiconductor layer 23, and favorable transistor characteristics are able to be restored. Therefore, in the case where the display unit is configured by using the TFT 20, low resistance of the oxide semiconductor layer 23 of the TFT 20 is inhibited, and thereby the leakage current is able to be suppressed, and light display with high luminance is enabled.

Modified Example 3-1

Figure 28:
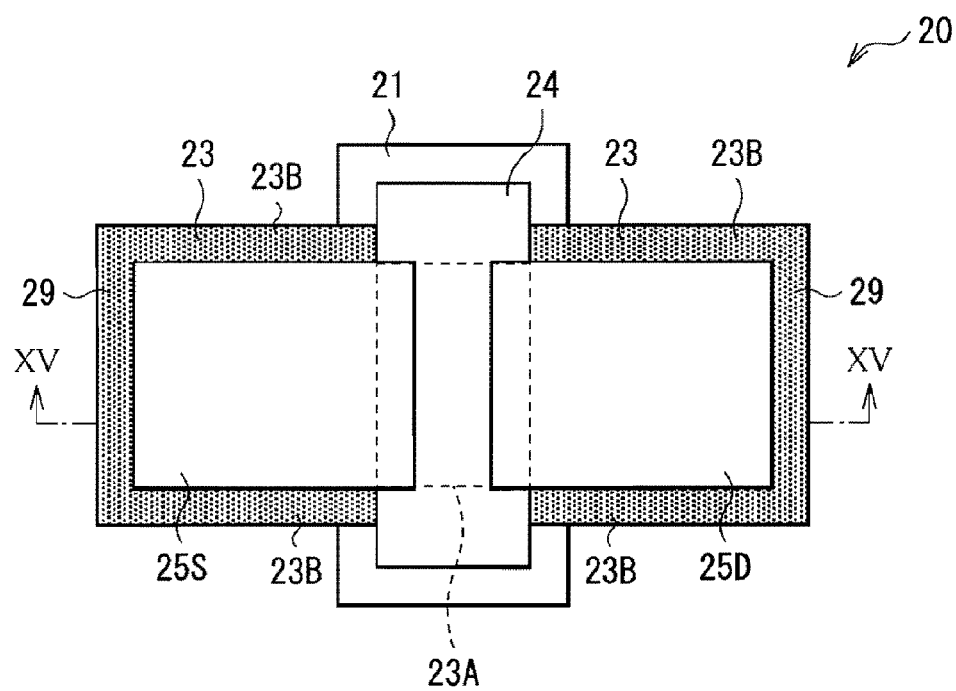
FIG. 28 is a plan view illustrating a structure of a TFT according to Modified example 3-1.
Figure 29:
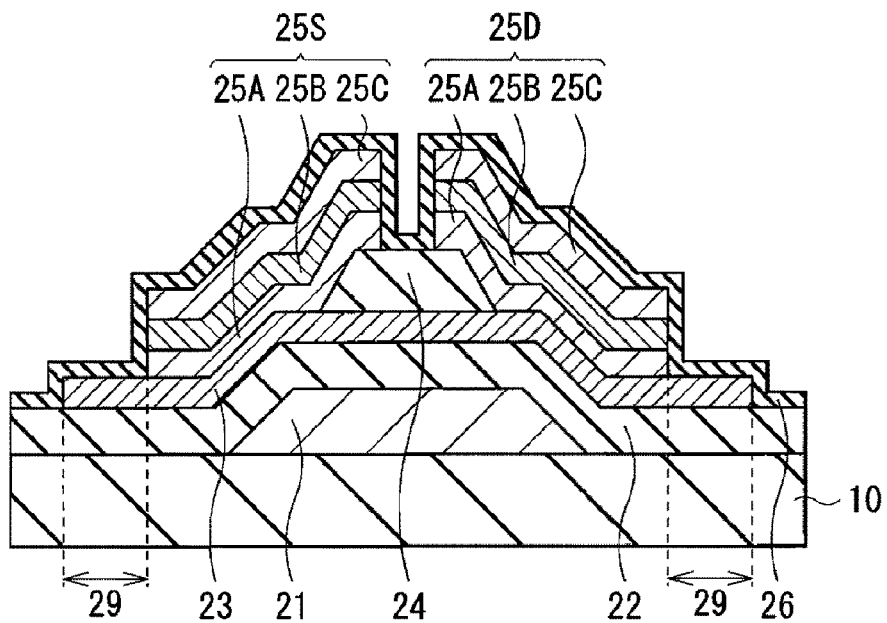
FIG. 29 is a cross sectional view illustrating a structure of the TFT illustrated in FIG. 28.

In the foregoing embodiment, the description has been given of the case that the protrusion region 29 is provided on one side of the drain electrode 25D. However, according to the structure of the TFT 20, as illustrated in FIG. 28 and FIG. 29, the protrusion region 29 may be provided outside of both the source electrode 25S and the drain electrode 25D.

Modified Example 3-2

Figure 30:
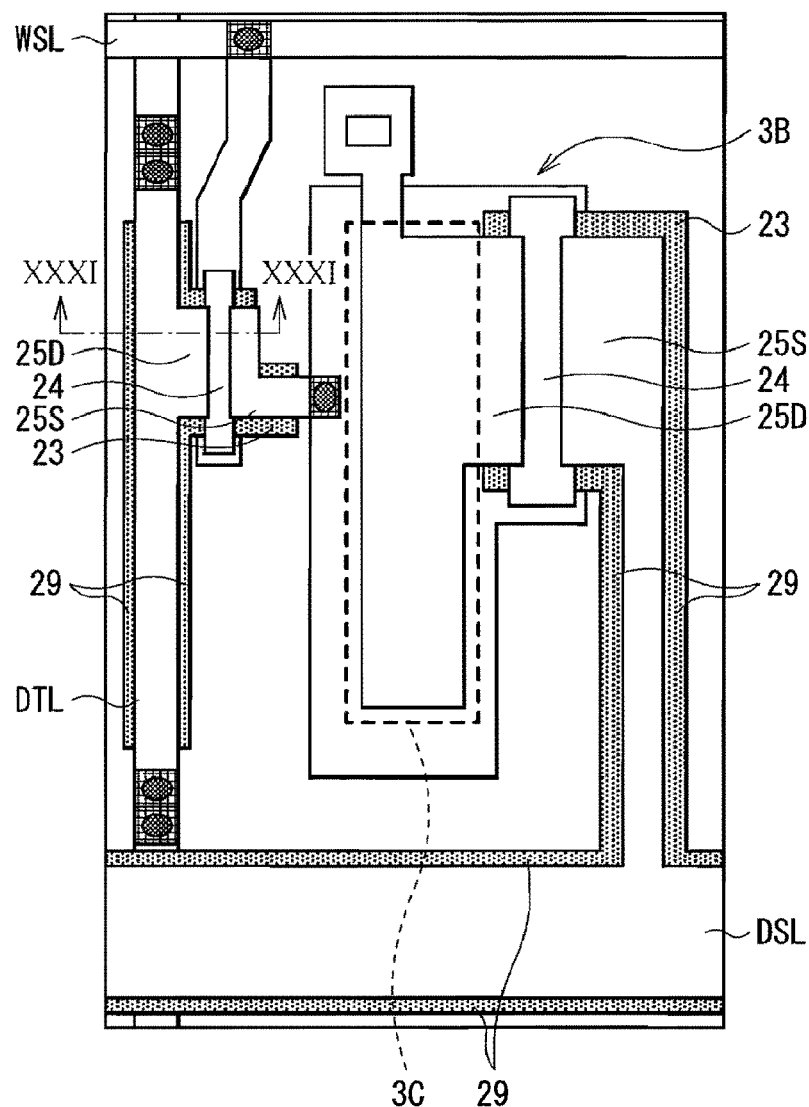
FIG. 30 is a plan view illustrating a configuration of a pixel circuit according to Modified example 3-2.
Figure 31:
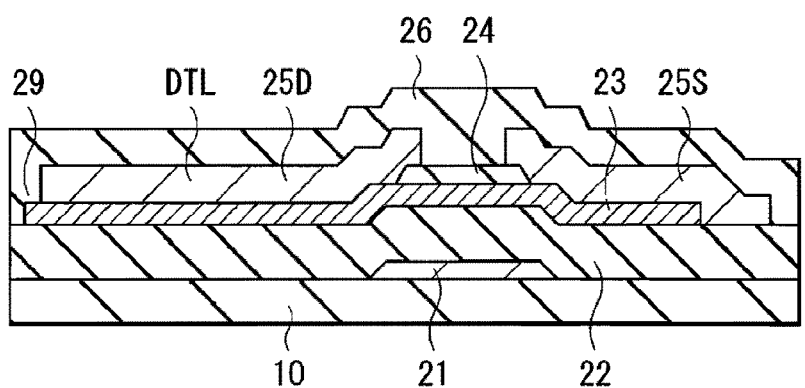
FIG. 31 is a cross sectional view illustrating a configuration of the sampling transistor illustrated in FIG. 30.

FIG. 30 illustrates a planar structure of the pixel circuit 140 according to Modified example 3-2. FIG. 31 illustrates a cross sectional structure of the sampling transistor 3A and the signal line DTL illustrated in FIG. 30. In the pixel circuit 140, the oxide semiconductor layer 23 extends from a section below the source electrode 25S or the drain electrode 25D to a section below wirings such as the signal line DTL and the power line DSL. The protrusion region 29 is provided in the wirings such as the signal line DTL and the power line DSL. Thereby, in the pixel circuit 140, oxygen is easily supplied to the oxide semiconductor layer 23 of the sampling transistor 3A or the drive transistor 3B, and favorable transistor characteristics are able to be restored.

Modified Example 3-3

Figure 32:
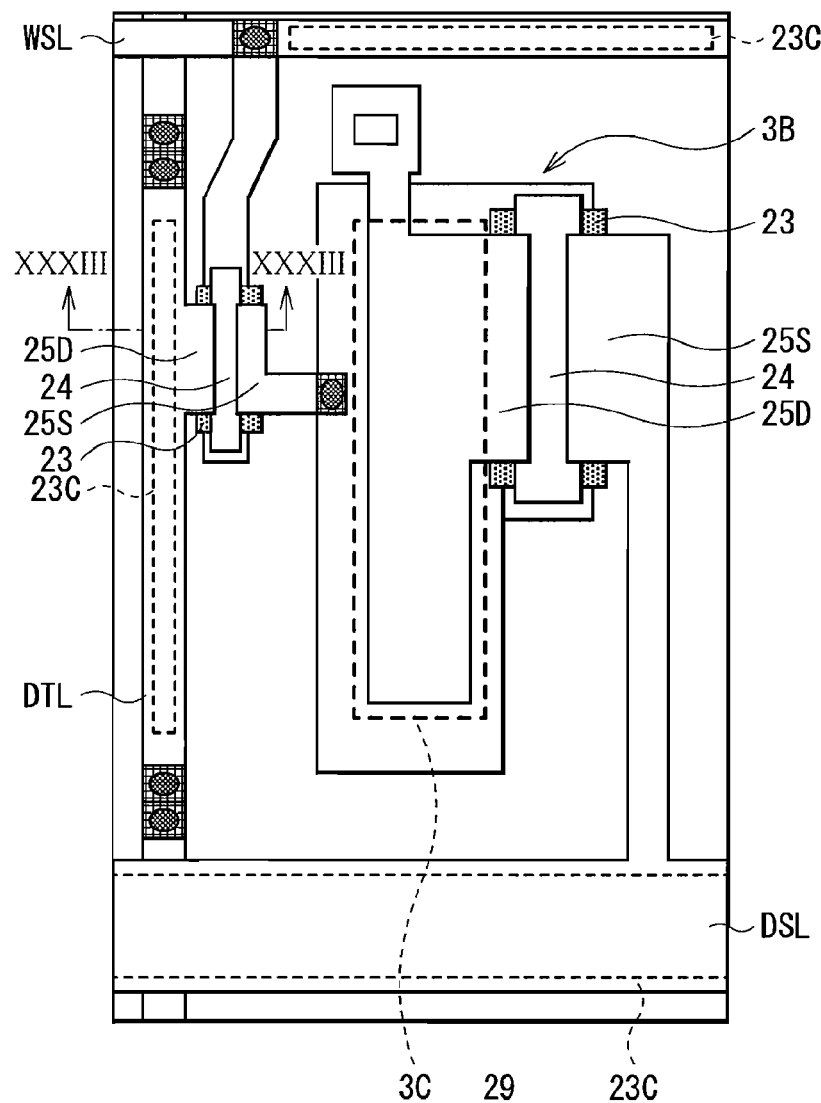
FIG. 32 is a plan view illustrating a configuration of a pixel circuit according to Modified example 3-3.
Figure 33:
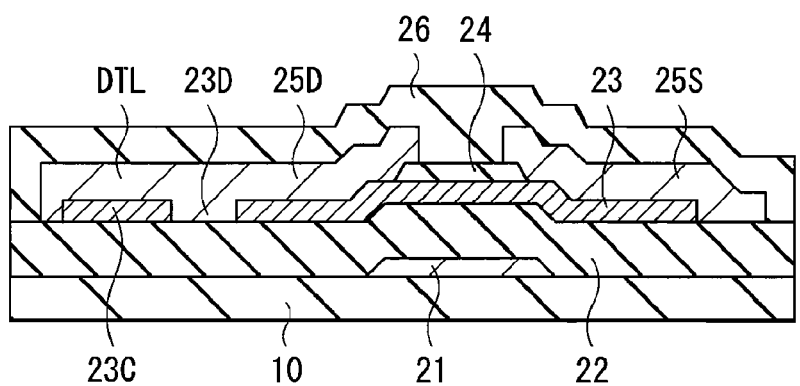
FIG. 33 is a cross sectional view illustrating a configuration of the sampling transistor illustrated in FIG. 32.

FIG. 32 illustrates a planar structure of the pixel circuit 140 according to Modified example 3-3. FIG. 33 illustrates a cross sectional structure of the sampling transistor 3A and the signal line DTL illustrated in FIG. 32. In the pixel circuit 140, an under-wiring oxide semiconductor layer 23C is provided below wirings such as the scanning line WSL, the signal line DTL, and the power line DSL. The under-wiring oxide semiconductor layer 23C is isolated form the oxide semiconductor layer 23 as an active layer of the sampling transistor 3A or the drive transistor 3B by an isolation groove 23D. The wirings such as the scanning line WSL, the signal line DTL, and the power line DSL have a wider width than that of the under-wiring oxide semiconductor layer 23C, and cover the entire surface of the under-wiring oxide semiconductor layer 23C. Thus, in the under-wiring oxide semiconductor layer 23C, oxygen is kept detached in the manufacturing step, and oxygen is not introduced by annealing for restoring the characteristics of the oxide semiconductor layer 23. The under-wiring oxide semiconductor layer 23C has characteristics as a metal, and configures part of the wirings. Further, the under-wiring oxide semiconductor layer 23C is able to be formed with the use of the same mask as that of the oxide semiconductor layer 23. Thereby, in the pixel circuit 140, without using a plurality of masks, resistance of the scanning line WSL, the signal line DTL, or the power line DSL is able to be lowered. Thus, image faults such as crosstalk and shading caused by wiring resistance are able to be suppressed at low cost.

Module and Application Examples

Figure 34:
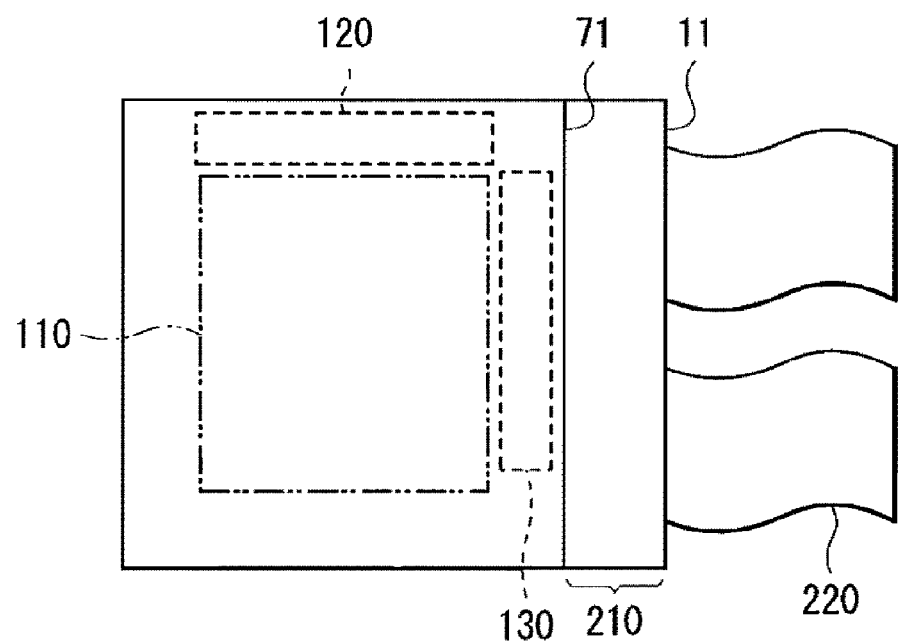
FIG. 34 is a plan view illustrating a schematic structure of a module including the display unit of the foregoing embodiments.

A description will be given of application examples of the display unit described in the foregoing embodiments. The display unit of the foregoing embodiments is applicable to a display unit of electronic devices in any field for displaying a video signal inputted from outside or a video signal generated inside as an image or a video such as a television device, a digital camera, a notebook personal computer, a portable terminal device such as a mobile phone, and a video camera. Module The display unit of the foregoing embodiments is incorporated in various electronic devices such as after-mentioned first to fifth application examples as a module as illustrated in FIG. 34, for example. In the module, for example, a region 210 exposed from the sealing substrate 71 and the adhesive layer 60 is provided in a side of a substrate 11, and an external connection terminal (not illustrated) is formed in the exposed region 210 by extending wirings of a signal line drive circuit 120 and a scanning line drive circuit 130. The external connection terminal may be provided with a Flexible Printed Circuit (FPC) 220 for inputting and outputting a signal.

First Application Example

Figure 35:
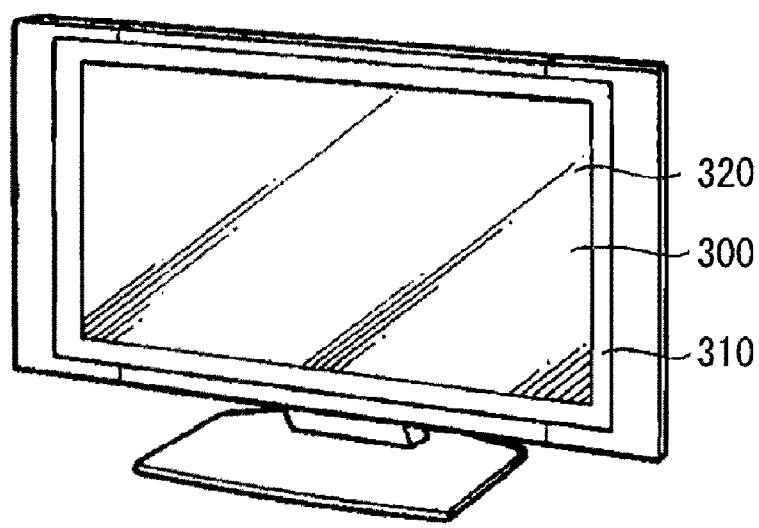
FIG. 35 is a perspective view illustrating an appearance of a first application example of the display unit of the foregoing embodiments.

FIG. 35 illustrates an appearance of a television device to which the display unit of the foregoing embodiments is applied. The television device has, for example, a video display screen section 300 including a front panel 310 and a filter glass 320. The video display screen section 300 is composed of the display unit according to the foregoing respective embodiments.

Second Application Example

Figure 36A:
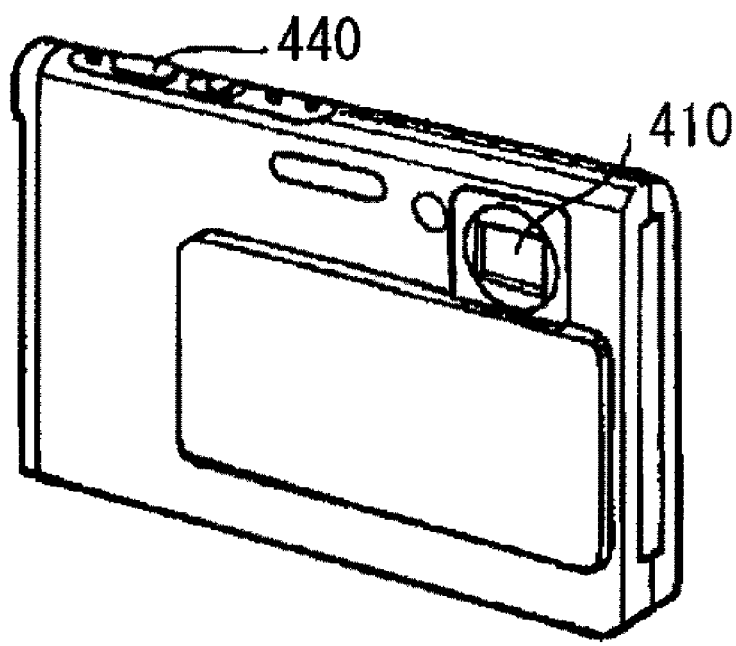
FIG. 36A is a perspective view illustrating an appearance viewed from the front side of a second application example.
Figure 36B:
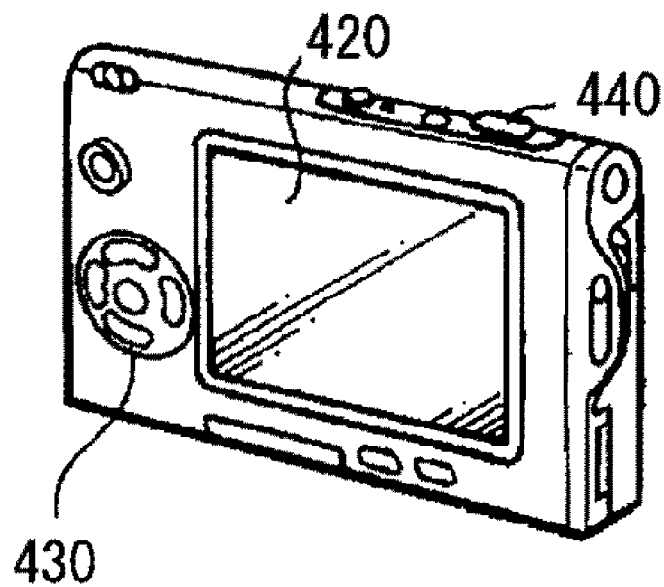
FIG. 36B is a perspective view illustrating an appearance viewed from the rear side of the second application example.

FIGS. 36A and 36B illustrate an appearance of a digital camera to which the display unit of the foregoing embodiments is applied. The digital camera has, for example, a light emitting section for a flash 410, a display section 420, a menu switch 430, and a shutter button 440. The display section 420 is composed of the display unit according to the foregoing respective embodiments.

Third Application Example

Figure 37:
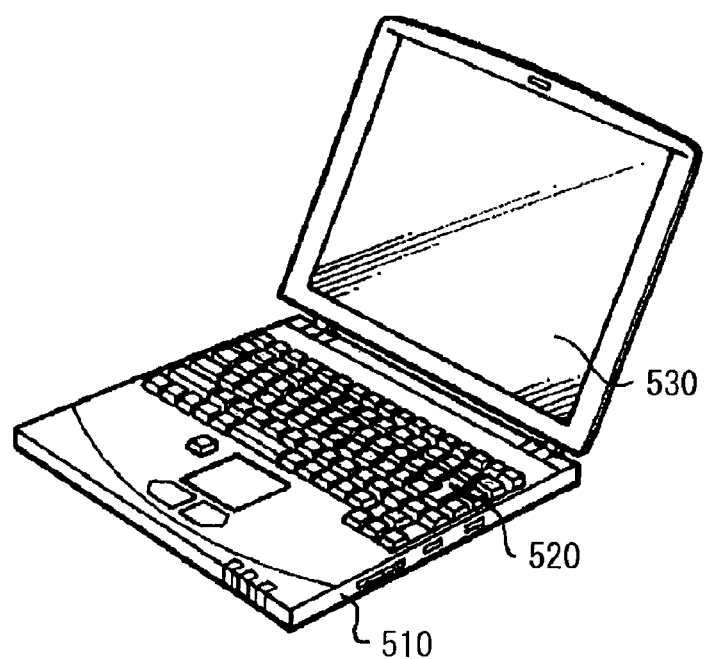
FIG. 37 is a perspective view illustrating an appearance of a third application example.

FIG. 37 illustrates an appearance of a notebook personal computer to which the display unit of the foregoing embodiments is applied. The notebook personal computer has, for example, a main body 510, a keyboard 520 for operation of inputting characters and the like, and a display section 530 for displaying an image. The display section 530 is composed of the display unit according to the foregoing respective embodiments.

Fourth Application Example

Figure 38:
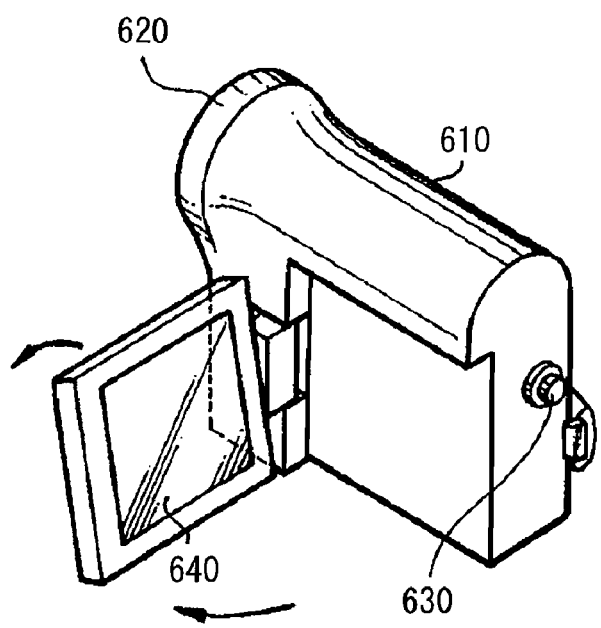
FIG. 38 is a perspective view illustrating an appearance of a fourth application example.

FIG. 38 illustrates an appearance of a video camera to which the display unit of the foregoing embodiments is applied. The video camera has, for example, a main body 610, a lens for capturing an object 620 provided on the front side face of the main body 610, a start/stop switch in capturing 630, and a display section 640. The display section 640 is composed of the display unit according to the foregoing respective embodiments.

Fifth Application Example

FIGS. 39A to 39G illustrate an appearance of a mobile phone to which the display unit of the foregoing embodiments is applied. In the mobile phone, for example, an upper package 710 and a lower package 720 are jointed by a joint section (hinge section) 730. The mobile phone has a display 740, a sub-display 750, a picture light 760, and a camera 770. The display 740 or the sub-display 750 is composed of the display unit according to the foregoing respective embodiments.

While the invention has been described with reference to the embodiments, the invention is not limited to the foregoing embodiments, and various modifications may be made. For example, the material, the thickness, the film-forming method, the film-forming conditions and the like of each layer are not limited to those described in the foregoing embodiments, but other material, other thickness, other film-forming method, and other film-forming conditions may be adopted.

Further, in the foregoing embodiments, the description has been given of the case that the organic light emitting devices 10R, 10B, and 10G have a structure in which the anode 52, the organic layer 54 including the light emitting layer, and the cathode 55 are layered in this order over the TFT substrate 1. However, the lamination order is not limited thereto, as long as the organic light emitting devices 10R, 10B, and 10G have the organic layer 54 including the light emitting layer between the anode 52 and the cathode 55. For example, the organic light emitting devices 10R, 10B, and 10G may have a structure in which the cathode 55, the organic layer 54 including the light emitting layer, and the anode 52 are layered in this order over the TFT substrate 1.

Further, in the foregoing embodiments, the description has been given of the organic light emitting devices 10R, 10B, and 10G with the specific example. However, it is not necessary to provide the all layers, and other layer may be further included.

In addition, the invention is applicable to a display unit including other display device such as a liquid crystal display device, an inorganic electroluminescence device, an electrodeposition display device, and an electrochromic display device in addition to the organic light emitting device.

The present application contains subject matter related to that disclosed in Japanese Priority Patent Application JP 2009-027646 filed in the Japan Patent Office on Feb. 9, 2009, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A thin film transistor comprising sequentially over a substrate:
   a gate electrode;
   a gate insulting film;
   an oxide semiconductor layer including a channel region;
   a channel protective layer covering the channel region, and
   a source electrode and a drain electrode that are formed on the oxide semiconductor layer located on both sides of the channel protective layer,
   wherein,
      at least one of the source electrode and the drain electrode has an aperture that is formed in the electrode itself and penetrates to the oxide semiconductor layer.

2. The thin film transistor according to claim 1, wherein:
   the source electrode and the drain electrode each include a metal layer containing aluminum, copper, silver, or molybdenum as a main component, and
   the source electrode and the drain electrode are each made of a single layer film of the metal layer, or are each made of a laminated film composed of the metal layer and a metal layer or metal compound layer containing titanium, vanadium, niobium, tantalum, chromium, tungsten, nickel, zinc, or indium as a main component.

3. The thin film transistor according to claim 1, wherein each of the source electrode and the drain electrode includes a layer composed of a metal that does not make oxygen detached from the oxide semiconductor layer or composed of a metal compound that does not make oxygen detached from the oxide semiconductor layer, the layer being in contact with the oxide semiconductor layer.

4. The thin film transistor according to claim 3, wherein the layer is composed of (i) molybdenum, (ii) an oxide, a nitride, or a nitroxide of molybdenum, (iii) an oxide, a nitride, or a nitroxide of titanium, (iv) an aluminum nitride, or (v) a copper oxide.

5. The thin film transistor according to claim 1, wherein each of the source electrode and the drain electrode is made of a plurality of layers including an uppermost layer composed of (i) titanium, or (ii) an oxide, a nitride, or a nitroxide of titanium.

6. The thin film transistor according to claim 1, wherein each of the source electrode and the drain electrode includes a layer composed of (i) a conductive metal oxide, (ii) a conductive metal nitride, or (iii) a conductive metal nitroxide, the layer being in contact with the oxide semiconductor layer.

7. A display unit comprising:
a thin film transistor; and
a display device, wherein the thin film transistor includes sequentially over a substrate:
a gate electrode,
a gate insulting film,
an oxide semiconductor layer including a channel region,
a channel protective layer covering the channel region, and
a source electrode and a drain electrode that are formed on the oxide semiconductor layer located on both sides of the channel protective layer,
wherein,
at least one of the source electrode and the drain electrode has an aperture that is formed in the electrode itself and penetrates to the oxide semiconductor layer.

8. The display unit according to claim 7, wherein the display device is an organic light emitting device having an organic layer including a light emitting layer between an anode and a cathode.

* * * * *